(12) United States Patent  
Kanda

(10) Patent No.: US 11,744,064 B2  
(45) Date of Patent: Aug. 29, 2023

(54) SEMICONDUCTOR CIRCUIT AND ELECTRONIC APPARATUS

(71) Applicant: Sony Semiconductor Solutions Corporation, Kanagawa (JP)

(72) Inventor: Yasuo Kanda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 180 days.

(21) Appl. No.: 17/431,201

(22) PCT Filed: Feb. 18, 2020

(86) PCT No.: PCT/JP2020/006281  
§ 371 (c)(1),  
(2) Date: Aug. 16, 2021

(87) PCT Pub. No.: WO2020/189147  
PCT Pub. Date: Sep. 24, 2020

(65) Prior Publication Data  
US 2022/0149055 A1 May 12, 2022

(30) Foreign Application Priority Data  
Mar. 15, 2019 (JP) .................. 2019-048576

(51) Int. Cl.  
*G11C 17/16* (2006.01)  
*H10B 20/20* (2023.01)  
*G11C 17/18* (2006.01)

(52) U.S. Cl.  
CPC ............ *H10B 20/20* (2023.02); *G11C 17/16* (2013.01); *G11C 17/18* (2013.01)

(58) Field of Classification Search  
CPC ....................................................... G11C 17/16  
(Continued)

(56) References Cited

U.S. PATENT DOCUMENTS 7,269,081 B2* 9/2007 Ito .................. G11C 17/18  
365/96  
2011/0080764 A1* 4/2011 Furukawa ............ G11C 17/18  
365/96

(Continued)

FOREIGN PATENT DOCUMENTS

JP 2010-225259 A 10/2010  
JP 2011-008861 A 1/2011  
(Continued)

OTHER PUBLICATIONS

International Search Report issued in International Patent Application No. PCT/JP2020/006281 dated May 19, 2020 and English translation of same. 5 pages.

(Continued)

*Primary Examiner* — Muna A Techane  
(74) *Attorney, Agent, or Firm* — K&L Gates LLP

(57) ABSTRACT

A semiconductor circuit according to the present disclosure includes: a first memory element including a first terminal, a second terminal coupled to a first node, and a tunnel barrier film, and configured to store information by breaking the tunnel barrier film; a first transistor including a drain coupled to the first node, a source, a gate, and a back gate coupled to a second node; and a second transistor including a drain, a source coupled to the second node, and a gate coupled to the first node.

15 Claims, 17 Drawing Sheets

(58) Field of Classification Search
USPC .......................................................... 365/96
See application file for complete search history.

(56) References Cited

U.S. PATENT DOCUMENTS

2014/0071741 A1    3/2014  Kim et al.
2021/0166759 A1*  6/2021  Shuto ...................... G11C 7/02

FOREIGN PATENT DOCUMENTS

| JP | 2012-174863 A | 9/2012 |
| JP | 2012-174864 A | 9/2012 |
| JP | 2013-537679 A | 10/2013 |
| JP | 2013-232494 A | 11/2013 |

OTHER PUBLICATIONS

Written Opinion issued in International Patent Application No. PCT/JP2020/006281 dated May 19, 2020. 3 pages.

* cited by examiner

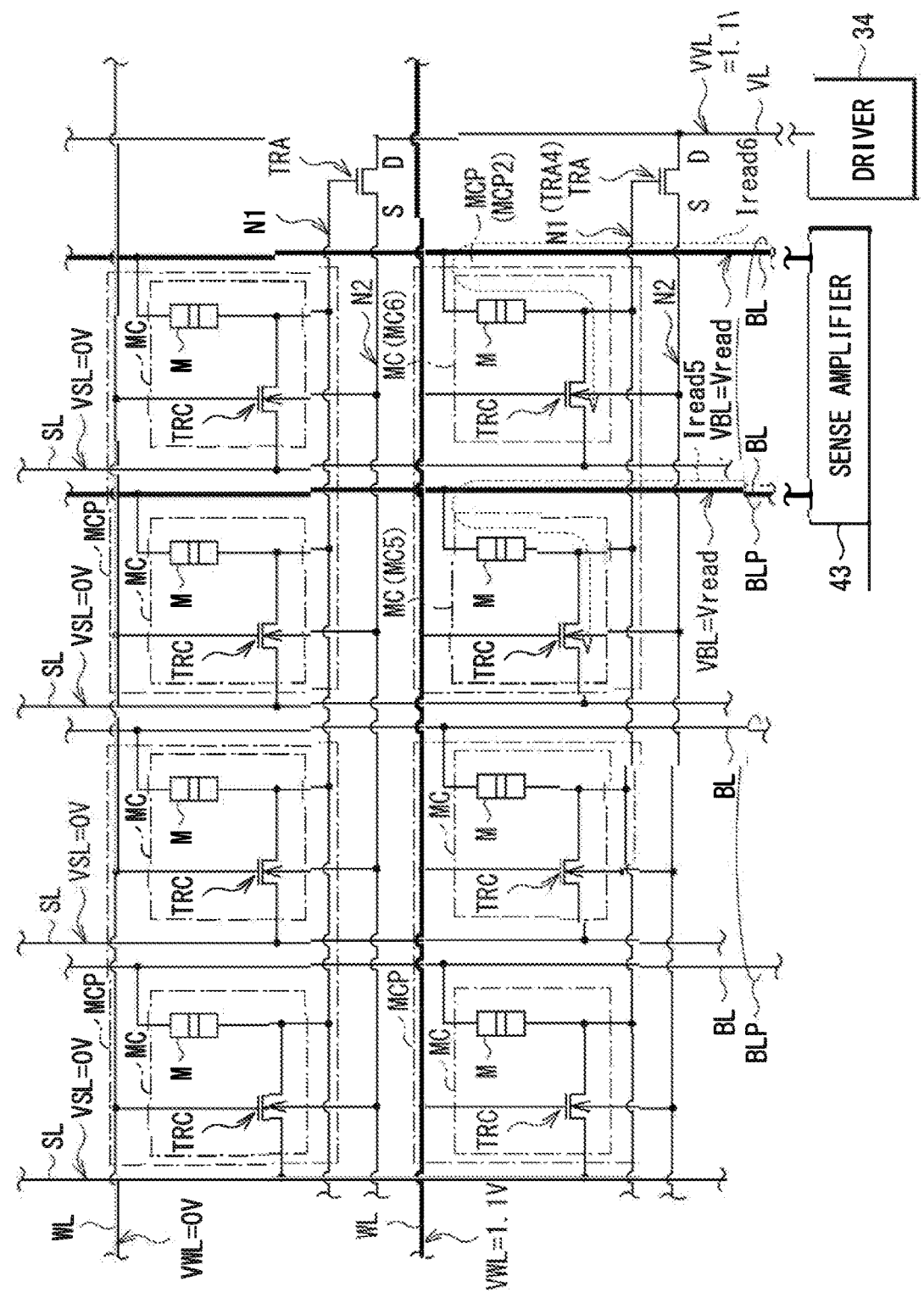
[FIG. 10]

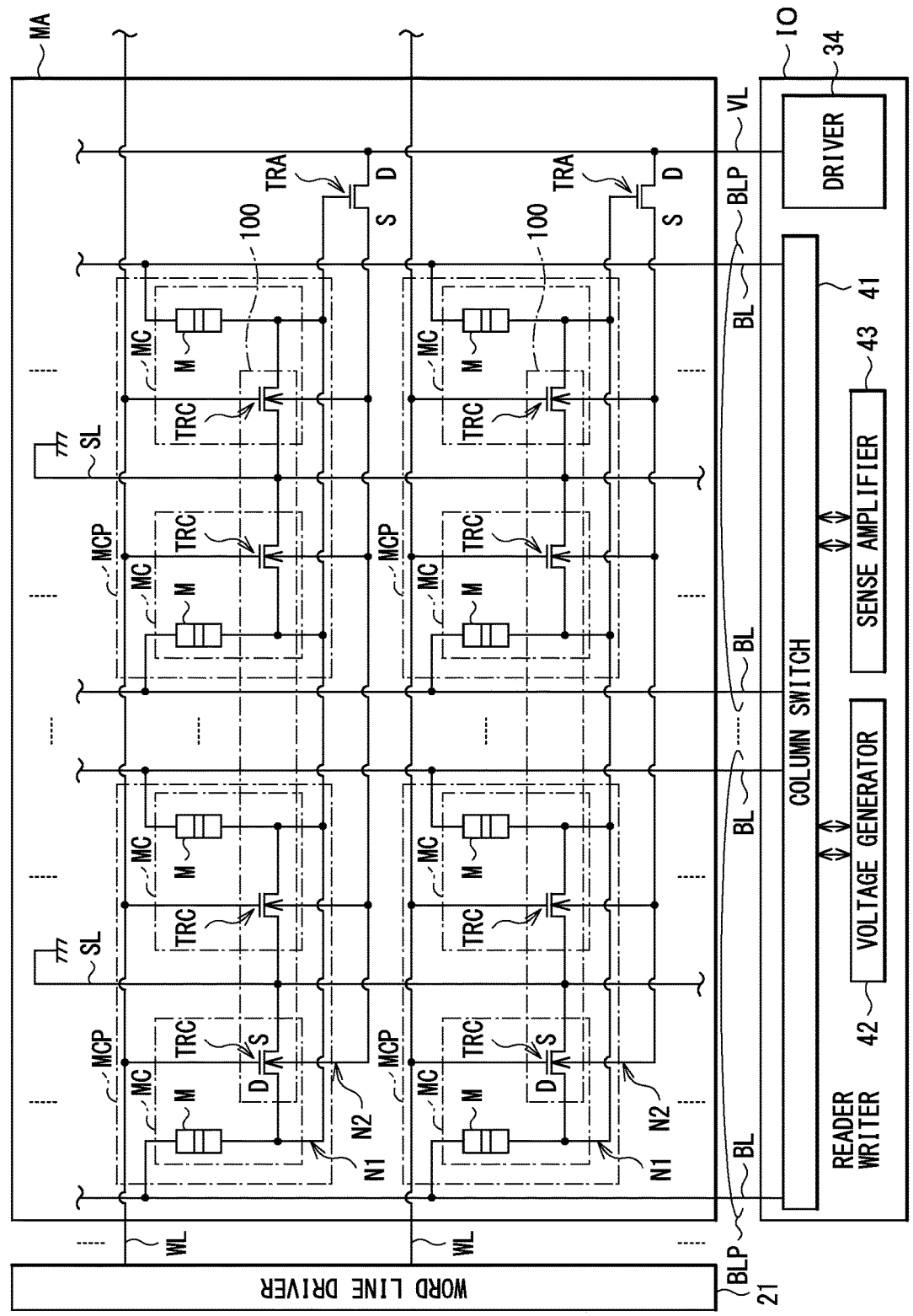
[ FIG. 11 ]

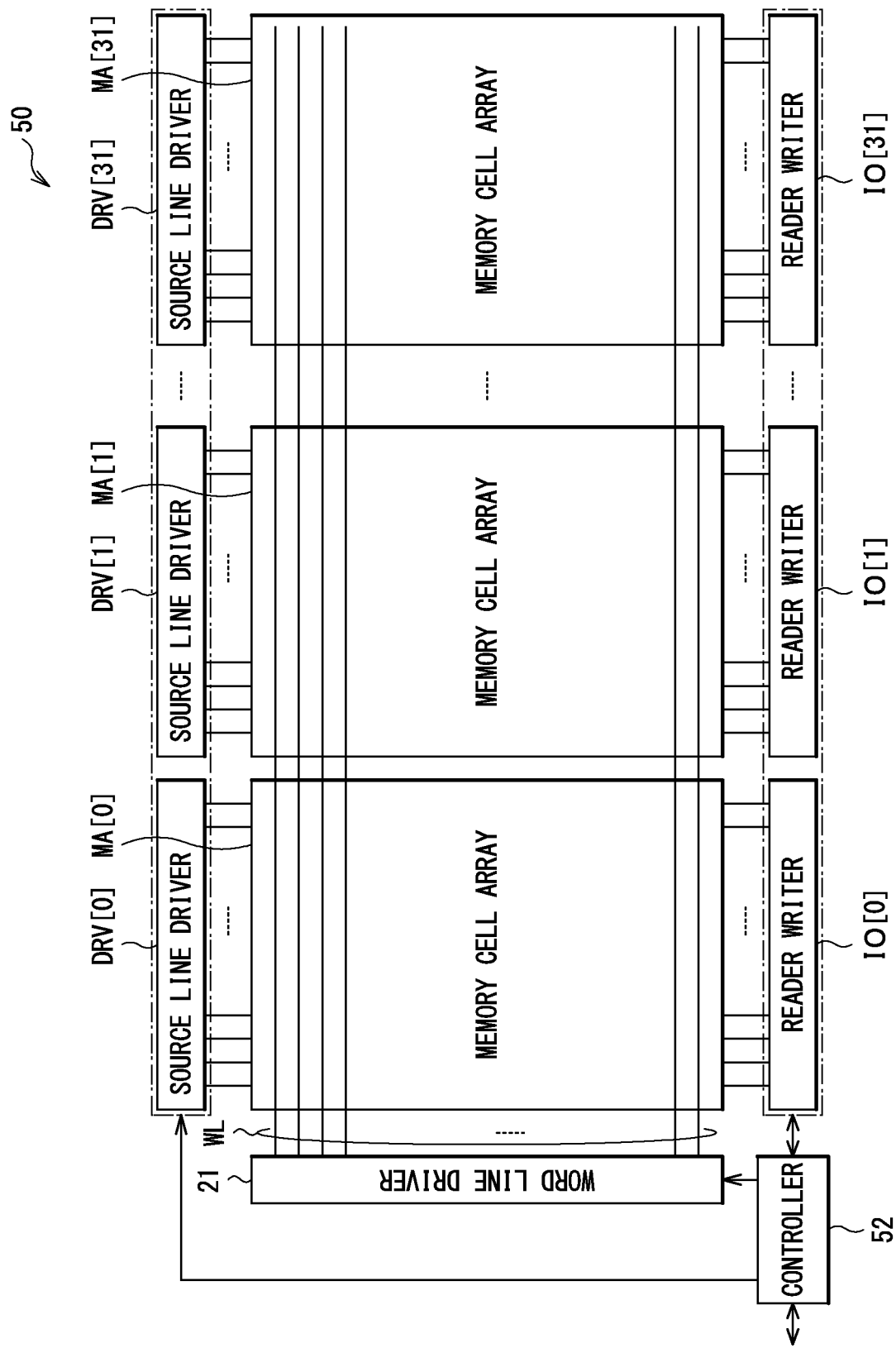
[ FIG. 12 ]

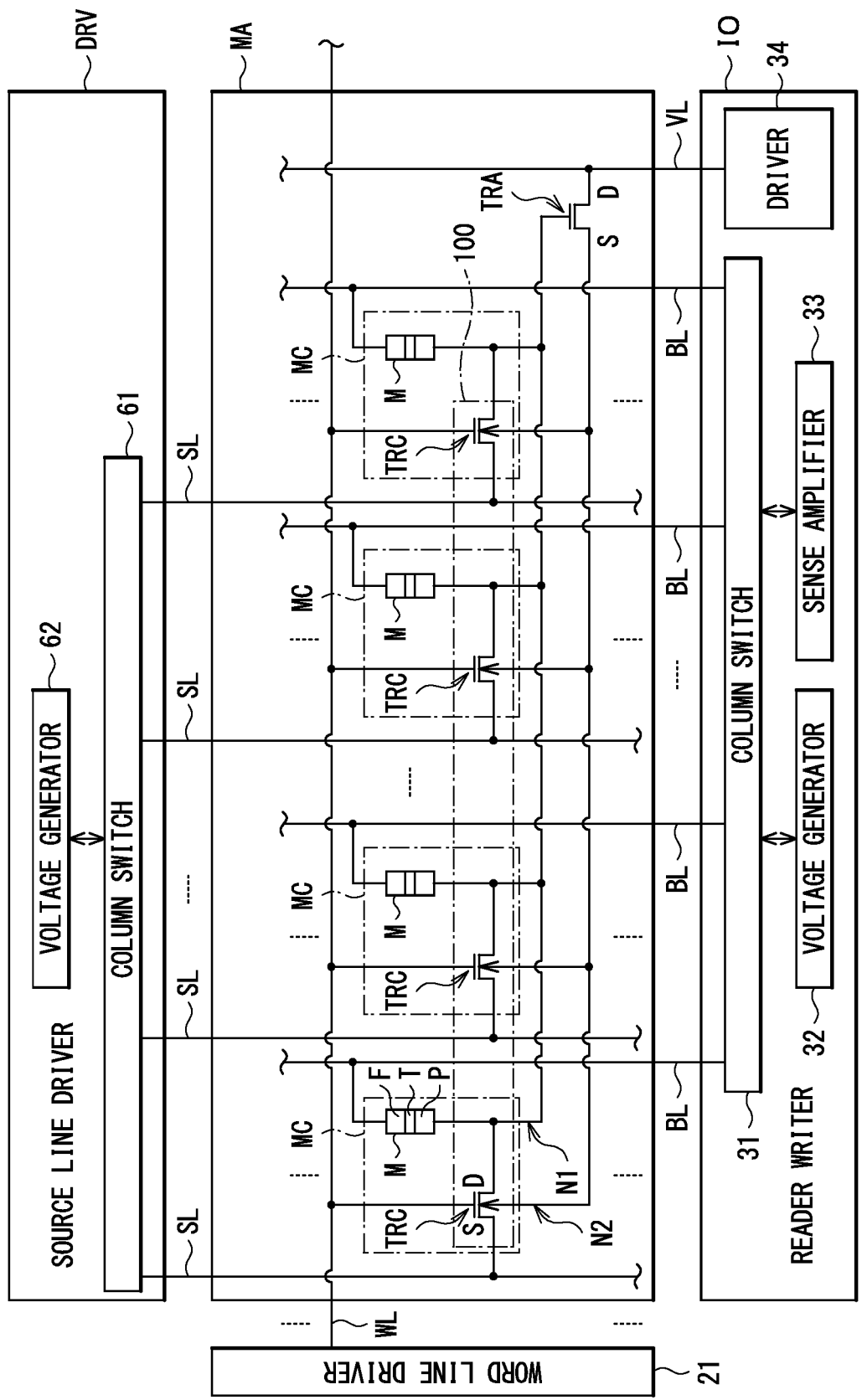
[ FIG. 13 ]

[FIG. 14]
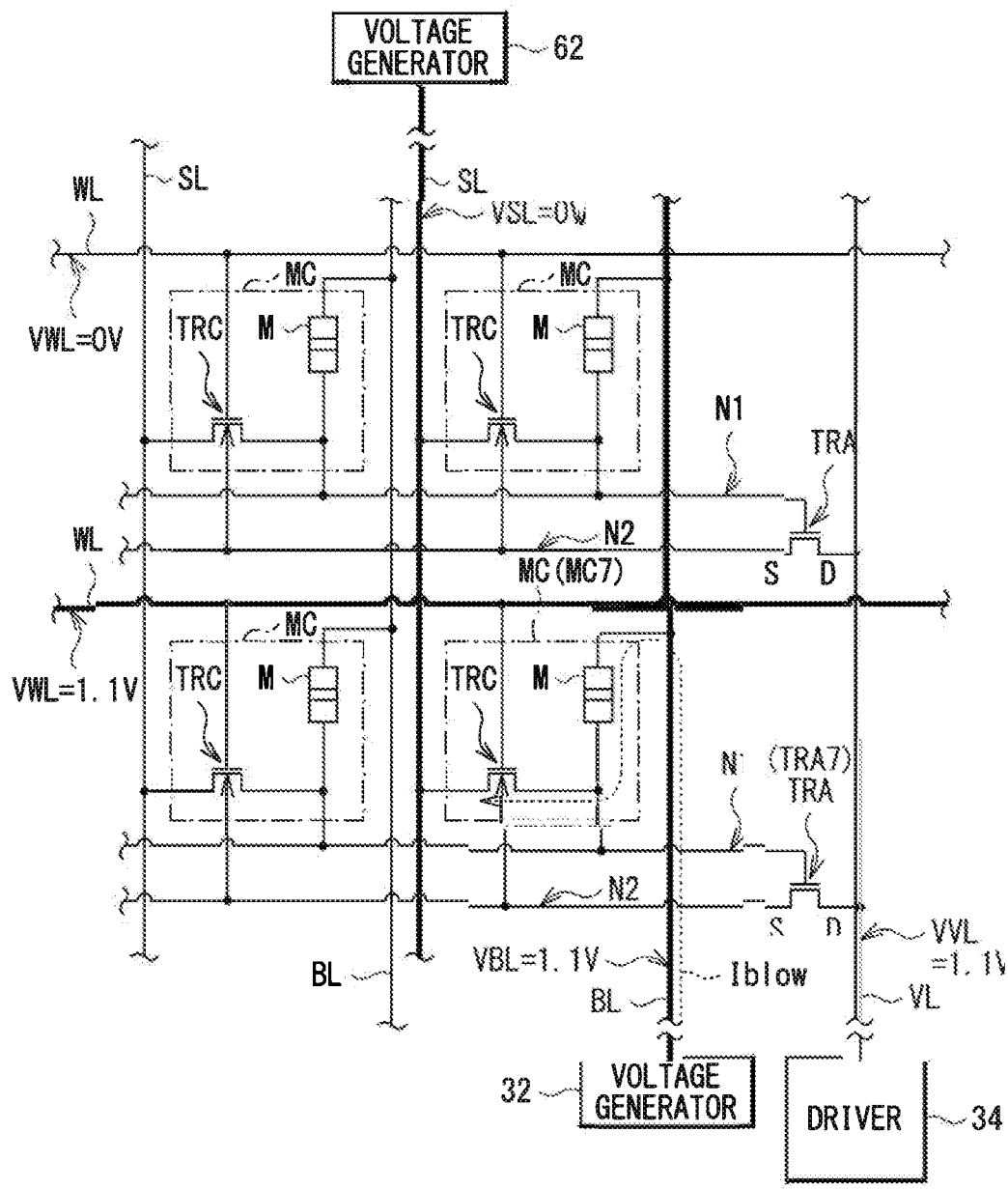

[FIG. 15]
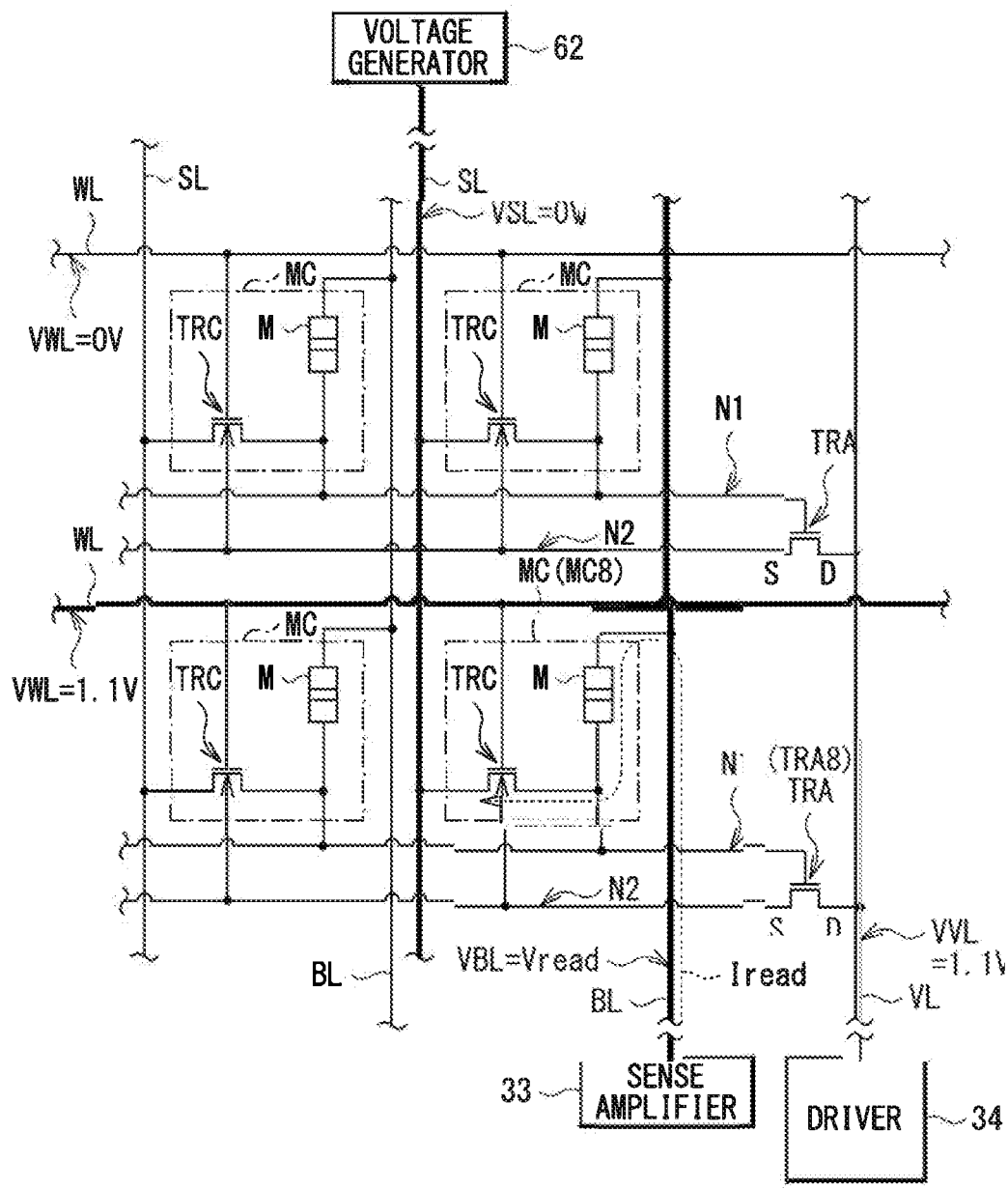

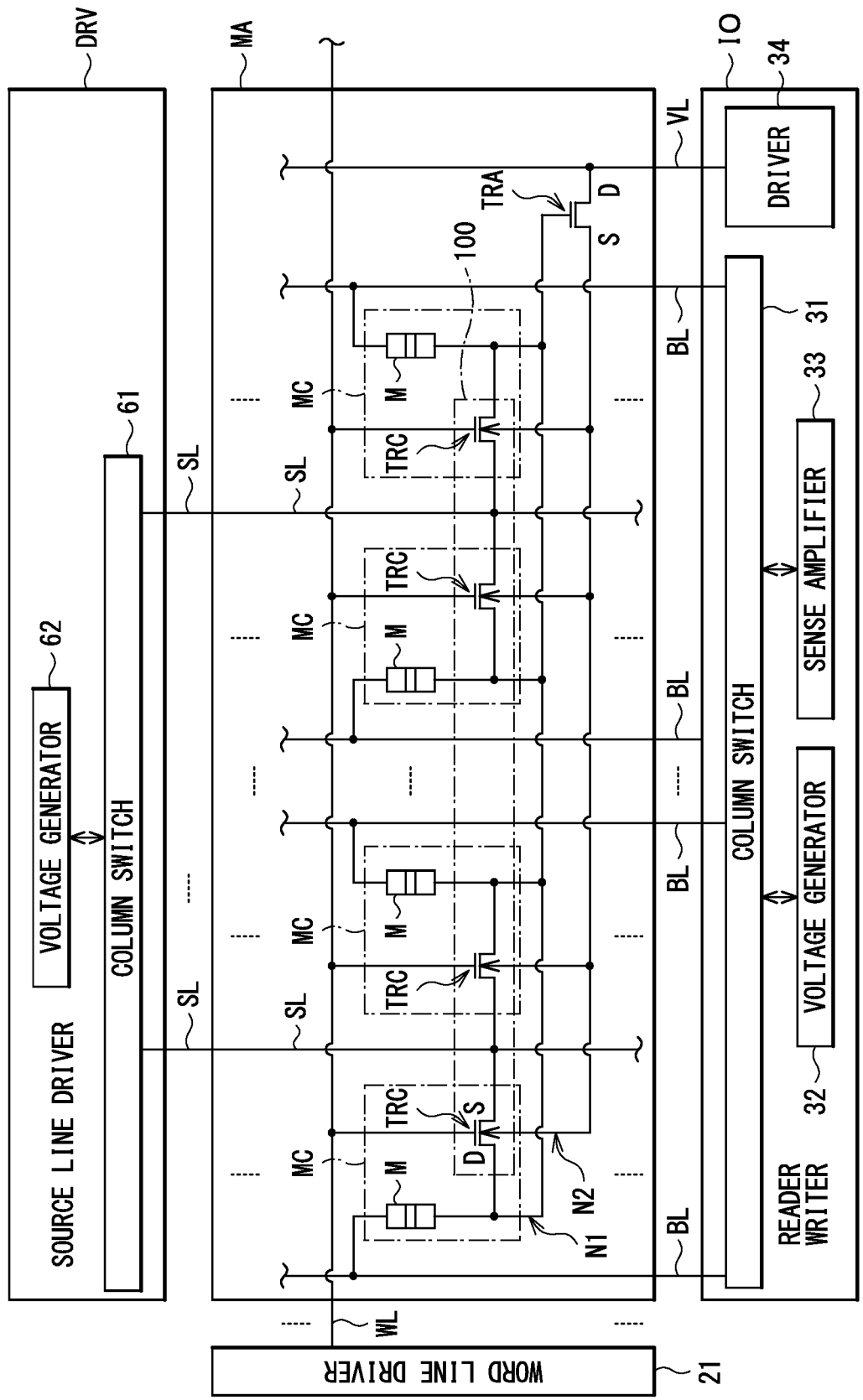
[ FIG. 16 ]

[ FIG. 17 ]
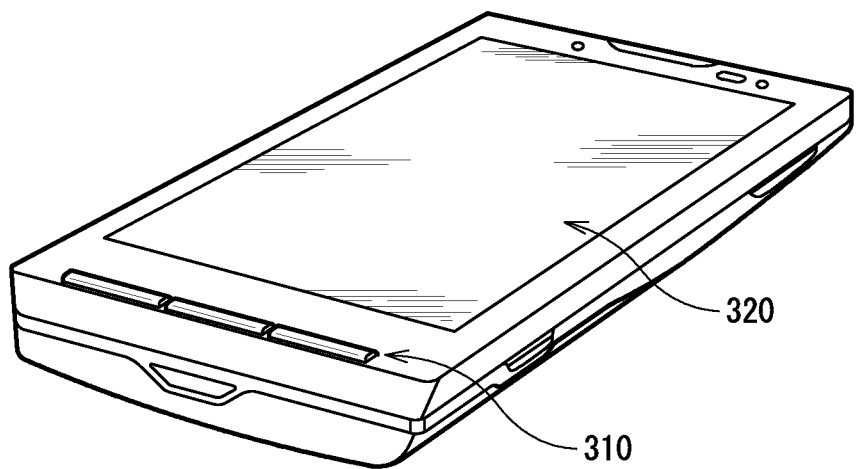

SEMICONDUCTOR CIRCUIT AND ELECTRONIC APPARATUS

TECHNICAL FIELD

The present disclosure relates to a semiconductor circuit configured to store information and an electronic apparatus that includes the semiconductor circuit.

BACKGROUND ART

A semiconductor circuit often includes a so-called OTP (One Time Programmable) memory configured to write information once. Patent Literature 1 discloses a technique that structures the OTP memory using a magnetic tunnel junction (MTJ: Magnetic Tunnel Junction) device.

CITATION LIST

Patent Literature

Patent Literature 1: Japanese Unexamined Patent Application Publication No. 2010-225259

SUMMARY OF THE INVENTION

Incidentally, in an OTP memory, it is desired that a size of a memory cell is small, and a further reduction of the size is expected.

It is desirable to provide a semiconductor circuit and an electronic apparatus that make it possible to reduce a size of a memory cell.

A semiconductor circuit according to one embodiment of the present disclosure includes a first memory element, a first transistor, and a second transistor. The first memory element includes a first terminal, a second terminal coupled to a first node, and a tunnel barrier film, and is configured to store information by breaking the tunnel barrier film. The first transistor includes a drain coupled to the first node, a source, a gate, and a back gate coupled to a second node. The second transistor includes a drain, a source coupled to the second node, and a gate coupled to the first node.

An electronic apparatus according to one embodiment of the present disclosure includes a first memory element, a first transistor, a second transistor, and a processing circuit. The first memory element includes a first terminal, a second terminal coupled to a first node, and a tunnel barrier film, and is configured to store information by breaking the tunnel barrier film. The first transistor includes a drain coupled to the first node, a source, a gate, and a back gate coupled to a second node. The second transistor includes a drain, a source coupled to the second node, and a gate coupled to the first node. The processing circuit is configured to perform a process, on the basis of the information stored in the first memory element.

The semiconductor circuit or the electronic apparatus according to one embodiment of the present disclosure includes the first memory element having the tunnel barrier film and configured to store the information by breaking the tunnel barrier film. The second terminal of the first memory element is coupled to the first node. The drain of the first transistor is coupled to the first node, and the back gate of the first transistor is coupled to the second node. The gate of the second transistor is coupled to the first node, and the source of the second transistor is couped to the second node.

BRIEF DESCRIPTION OF THE DRAWINGS

FIG. 10 is an explanatory diagram illustrating an example of the read operation in the memory circuit illustrated in FIG. 8.

FIG. 11 is a circuit diagram illustrating a configuration example of a memory circuit according to another modification example.

FIG. 12 is a block diagram illustrating a configuration example of a memory circuit according to another modification example.

FIG. 13 is a circuit diagram illustrating a configuration example of the memory circuit illustrated in FIG. 12.

FIG. 14 is an explanatory diagram illustrating an example of the write operation in the memory circuit illustrated in FIG. 13.

FIG. 15 is an explanatory diagram illustrating an example of the read operation in the memory circuit illustrated in FIG. 13.

FIG. 16 is a circuit diagram illustrating a configuration example of a memory circuit according to another modification example.

FIG. 17 is a perspective diagram illustrating an external appearance configuration of a smartphone to which an embodiment is applied.

MODES FOR CARRYING OUT THE INVENTION

Hereinafter, embodiments of the present disclosure will be described in detail with reference to the drawings. Note that the description will be made in the following order.
1. Embodiment
2. Application Example

1. Embodiment

Configuration Example

Figure 1:
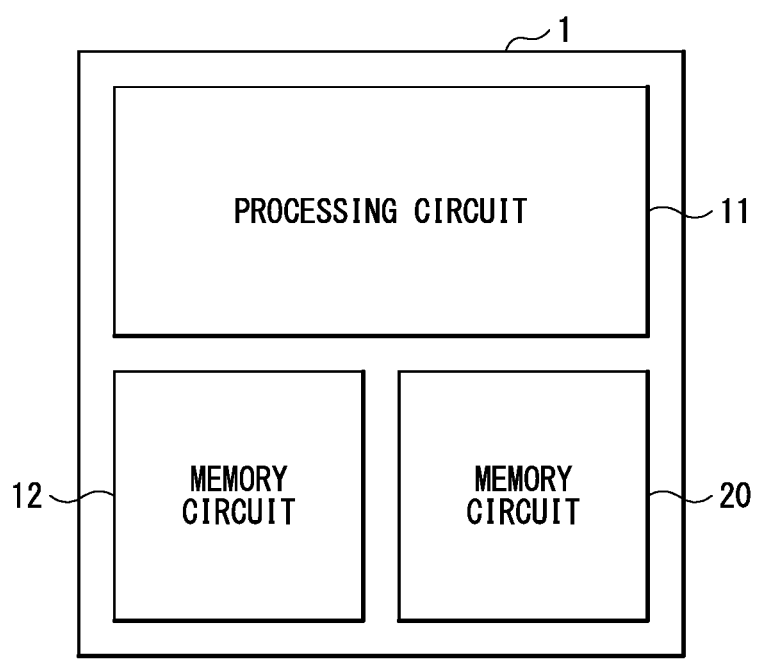
FIG. 1 is a block diagram illustrating a configuration example of a semiconductor circuit according to an embodiment of the present disclosure.

FIG. 1 illustrates a configuration example of a semiconductor circuit (a semiconductor circuit 1) according to an embodiment. The semiconductor circuit 1 is configured to operate on the basis of stored information. The semiconductor circuit 1 is formed on one semiconductor chip in this example. The semiconductor circuit 1 includes a processing circuit 11, a memory circuit 12, and a memory circuit 20.

The processing circuit 11 includes, for example, a digital circuit and an analog circuit, and is configured to perform a predetermined process. The processing circuit 11 performs a process using, for example, information stored in the memory circuits 12 and 20.

The memory circuit 12 is a nonvolatile memory configured to store information and rewrite the information. The memory circuit 12 has a plurality of memory cells. The memory cells each have a memory element M. In this example, the memory element M is a spin transfer torque (STT: Spin Transfer Torque) magnetic tunnel junction element in which information is stored by changing an orientation of a magnetization of a free layer F (described later) by spin injection. The memory element M includes a free layer F, a tunnel barrier layer T, and a pinned layer P. The pinned layer P includes a ferromagnetic material whose direction of the magnetization is fixed in, for example, a film surface perpendicular direction. The free layer F includes a ferromagnetic material whose direction of the magnetization changes, for example, in the film surface perpendicular direction, in response to a spin-polarized current flowing thereto. The tunnel barrier layer T is configured to break a magnetic coupling between the pinned layer P and the free layer F and to allow a tunnel current to flow. The tunnel barrier layer T includes a material such as magnesium oxide (MgO), for example. It should be noted that it is not limited thereto, and, for example, alumina may be used alternatively.

The memory circuit 12 writes information to the memory element M by causing a current to flow to the memory element M and setting the direction of the magnetization in the free layer F of the memory element M. In the memory element M, a resistance value between terminals changes in accordance with the direction of the magnetization in the free layer F. In the memory circuit 12, the memory element M may take two resistance states RL and RH that are distinguishable from each other. The resistance state RH is a state in which the resistance value is high and the resistance state RL is a state in which the resistance value is low. The resistance value in the resistance state RL is, for example, about 10 kΩ.

The memory circuit 20 is a so-called OTP memory configured to store information and write information once.

Figure 2:
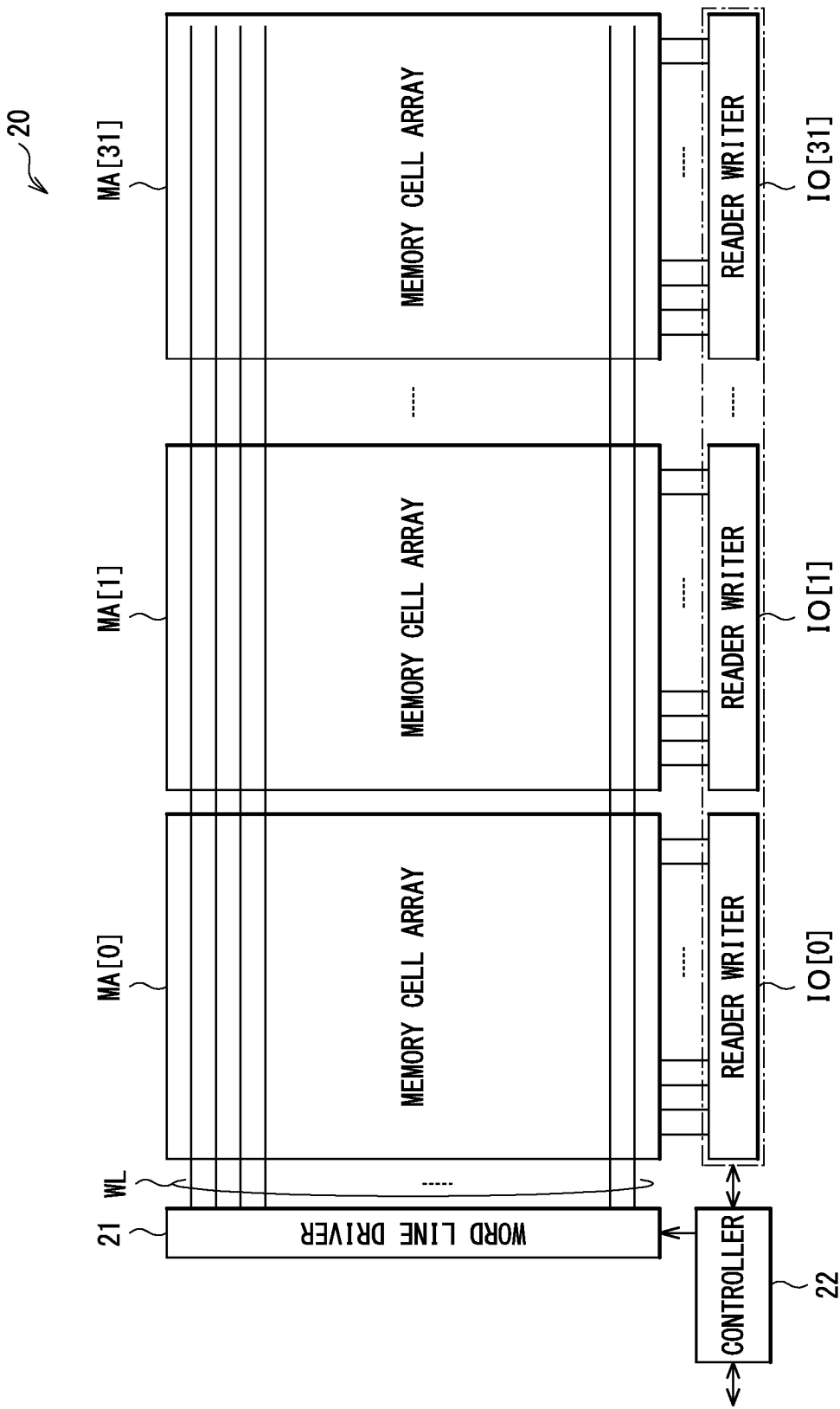
FIG. 2 is a block diagram illustrating a configuration example of a memory circuit illustrated in FIG. 1.

FIG. 2 illustrates a configuration example of the memory circuit 20. The memory circuit 20 has a plurality of memory cell arrays MA (32 memory cell arrays MA[0], MA[1], . . . , MA[31], in this example), a plurality of reader writers IO (32 reader writers IO[0], IO[1], . . . , IO[31], in this example), a word line driver 21, and a controller 22.

The plurality of memory cell arrays MA is respectively provided corresponding to the plurality of reader writers IO. Each of the plurality of memory cell arrays MA has a plurality of memory cells MC disposed in a matrix.

Figure 3:
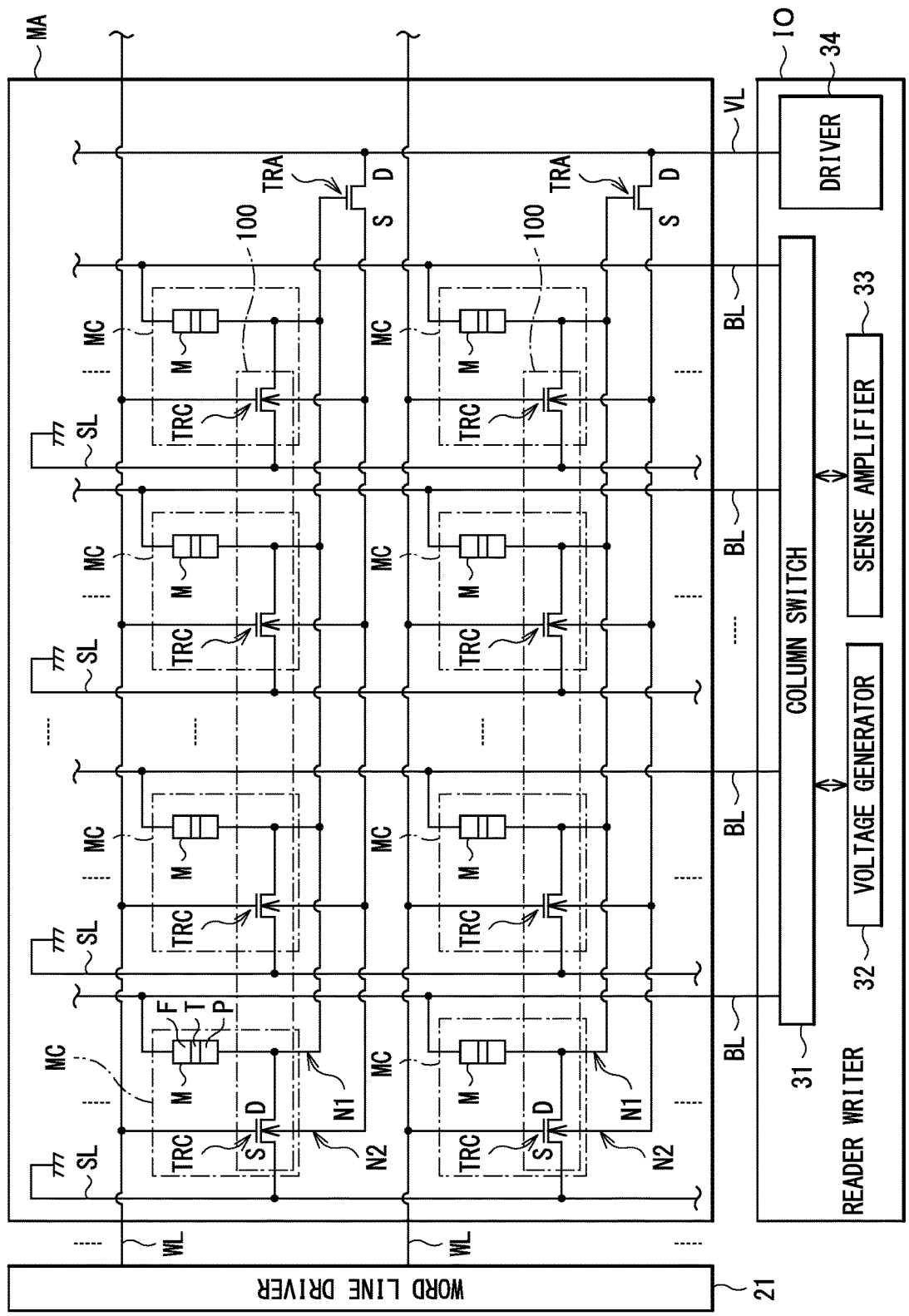
FIG. 3 is a circuit diagram illustrating a configuration example of the memory circuit illustrated in FIG. 2.

FIG. 3 illustrates a configuration example of the memory cell array MA. The memory cell array MA has a plurality of word lines WL, a plurality of bit lines BL, a plurality of source lines SL, and a voltage line VL. The word lines WL are provided to extend in a row direction (a lateral direction in FIG. 3), and are coupled to the word line driver 21. As illustrated in FIG. 2, the word lines WL are so provided as to cross over the plurality of memory cell arrays MA[0] to MA[31]. The bit lines BL are provided to extend in a column direction (a vertical direction in FIG. 3), and are coupled to the reader writer IO. The source lines SL are provided to extend in the column direction. The source lines SL are grounded in this example. The voltage line VL is provided to extend in the column direction, and is coupled to the reader writer IO. The memory cell array MA has the plurality of memory cells MC and a plurality of transistors TRA.

Each of the plurality of memory cells MC includes the memory element M and a transistor TRC.

The memory element M includes the free layer F, the tunnel barrier layer T, and the pinned layer P. That is, the memory element M of the memory circuit 20 has the same configuration as the memory element M of the memory circuit 12. In the memory cell MC, information is stored by breaking the tunnel barrier layer T of the memory element M. Specifically, a resistance value of the memory element M is reduced as a result of the breakage of the tunnel barrier layer T as with a so-called anti-fuse. In the memory circuit 20, the memory element M may take two resistance states RL and RS that are distinguishable from each other. The resistance state RS is a resistance state following a short-circuit breakage. The resistance value in the resistance state RS is lower than the resistance value in the resistance state RL. One end of the memory element M is coupled to the bit line BL and the other end is coupled to a node N1. In this example, the free layer F of the memory element M is coupled to the bit line BL and the pinned layer P is coupled to the node N1. It should be noted that it is not limited thereto. Alternatively, for example, the pinned layer P may be coupled to the bit line BL and the free layer F may be coupled to the node N1.

The transistor TRC is an N-type MOS (Metal Oxide Semiconductor) transistor, a drain of which is coupled to the node N1, a source of which is coupled to the source line SL, a gate of which is coupled to the word line WL, and a back gate of which is coupled to a node N2. The nodes N2 of the memory cells MC corresponding to one row that are provided side by side in the row direction (the lateral direction in FIG. 3) are coupled to each other. Specifically, the transistors TRC (a transistor group 100 in FIG. 3) of the memory cells MC corresponding to one row are formed on one P-type well (P-well).

Figure 4:
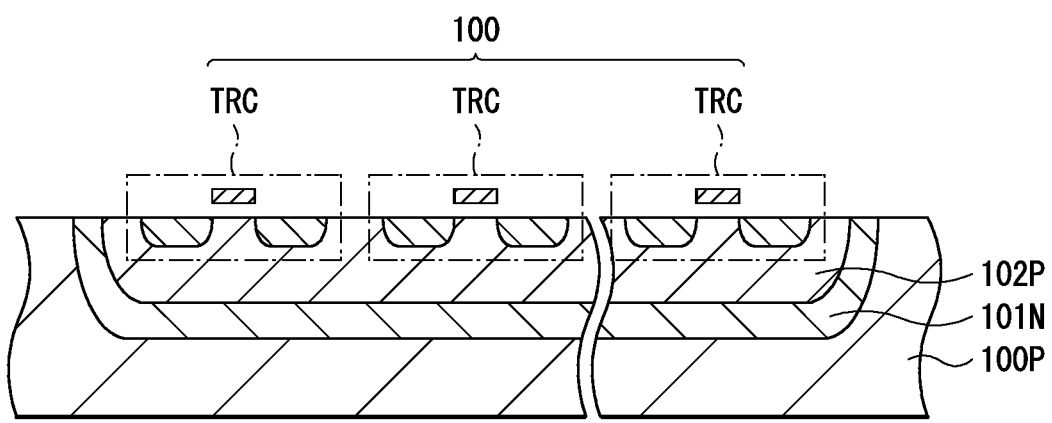
FIG. 4 is a schematic cross-sectional diagram illustrating a configuration example of a memory cell array illustrated in FIG. 3.

FIG. 4 illustrates a configuration example of the transistor group 100. In this example, an N-type region 101N is formed on a P-type semiconductor substrate 100P, and a P-well 102P is formed in the N-type region 101N. The semiconductor substrate 100P and the P-well 102P are electrically insulated from each other by the N-type region 101N. The transistors TRC of the memory cells MC corresponding to one row are formed on the P-well 102P. Thus, the back gates of the transistors TRC are electrically coupled to each other.

Note that although the transistors TRC of the memory cells MC corresponding to one row are formed on one P-well in this example, it is not limited thereto. The plurality of transistors TRC may be respectively formed on the plurality of P-wells.

In addition, as illustrated in FIG. 3, the nodes N1 of the memory cells MC corresponding to one row that are disposed side by side in the row direction (the lateral direction in FIG. 3) are coupled to each other.

Each of the plurality of transistors TRA is an N-type MOS transistor. The plurality of transistors TRA is respectively provided corresponding to the plurality of rows of the memory cells MC. A gate of the transistor TRA is coupled to the nodes N1 of the plurality of memory cells MC belonging to the corresponding row, a drain is coupled to the voltage line VL, and a source is coupled to the nodes N2 of the plurality of memory cells MC belonging to the corresponding row.

The word line driver 21 (FIG. 2) is configured to select one of the plurality of word lines WL by driving the plurality of word lines WL on the basis of a command from the controller 22.

The reader writer IO is configured to drive the plurality of bit lines BL and the voltage line VL and read information stored in the memory cell array MA on the basis of the command from the controller 22. As illustrated in FIG. 3, the reader writer IO includes a column switch 31, a voltage generator 32, a sense amplifier 33, and a driver 34.

The column switch 31 is configured to, in a write operation, select one of the plurality of bit lines BL and couple the selected bit line BL to the voltage generator 32, and place other bit lines BL into a floating state, on the basis of the command from the controller 22. Further, the column switch 31 is configured to, in a read operation, select one of the plurality of bit lines BL and couple the selected bit line BL to the sense amplifier 33, and place other bit lines BL into the floating state, on the basis of the command from the controller 22. The plurality of column switches 31 of the plurality of reader writers IO is adapted to select the bit lines BL that are the same as each other in number of order, on the basis of the command from the controller 22.

The voltage generator 32 is configured to, in the write operation, generate a ground voltage or a blow voltage to be applied to the selected bit line BL, on the basis of the command from the controller 22.

The sense amplifier 33 is configured to, in the read operation, generate a read voltage Vread to be applied to the selected bit line BL and read information stored in the memory cell MC on the basis of a current flowing through the selected bit line BL, on the basis of the command from the controller 22. The read voltage Vread may be, for example, a voltage lower than the blow voltage.

The driver 34 is configured to drive the voltage line VL, on the basis of the command from the controller 22.

The controller 22 (FIG. 2) is configured to control operations of the word line driver 21 and the plurality of reader writers 10 to write information to the memory cell MC of the plurality of memory cell arrays MA, on the basis of a write command and write data supplied from the processing circuit 11. Further, the controller 22 is configured to control operations of the word line driver 21 and the plurality of reader writers IO to read information from the memory cell MC of the plurality of memory cell arrays MA, on the basis of a read command supplied from the processing circuit 11.

Here, the memory element M corresponds to one concrete example of a "first memory element" and a "second memory element" of the present disclosure. The tunnel barrier layer T corresponds to one concrete example of a "tunnel barrier film" of the present disclosure. The transistor TRC corresponds to one concrete example of a "first transistor" and a "third transistor" of the present disclosure. The transistor TRA corresponds to one concrete example of a "second transistor" of the present disclosure. The node N1 corresponds to one concrete example of a "first node" of the present disclosure. The node N2 corresponds to one concrete example of a "second node" of the present disclosure. The word line driver 21 and the reader writer IO correspond to one concrete example of a "driver" of the present disclosure. The word line WL corresponds to one concrete example of a "first control line" of the present disclosure. The bit line BL corresponds to one concrete example of a "second control line" and a "third control line" of the present disclosure. The voltage line VL corresponds to one concrete example of a "fourth control line" of the present disclosure. The source line SL corresponds to one concrete example of a "fifth control line" and a "sixth control line" of the present disclosure. The memory circuit 12 corresponds to one concrete example of a "memory circuit" of the present disclosure. The processing circuit 11 corresponds to one concrete example of a "processing circuit" of the present disclosure.

[Operation and Working]

Next, an operation and working of the semiconductor circuit 1 of the present embodiment will be described.

(Outline of Overall Operation)

First, referring to FIGS. 1 to 3, an outline of an overall operation of the semiconductor circuit 1 will be described.

The controller 22 of the memory circuit 20 controls the operations of the word line driver 21 and the plurality of reader writers IO to write information to the memory cell MC of the plurality of memory cell arrays MA, on the basis of the write command and the write data supplied from the processing circuit 11 (FIG. 1). In the write operation, the word line driver 21 selects one of the plurality of word lines WL, on the basis of the command from the controller 22. In each of the plurality of reader writers the column switch 31 selects one of the plurality of bit lines BL and couples the selected bit line BL to the voltage generator 32, and places other bit lines BL into the floating state, on the basis of the command from the controller 22. The voltage generator 32 generates the ground voltage or the blow voltage to be applied to the selected bit line BL, on the basis of the command from the controller 22. The driver 34 drives the voltage line VL, on the basis of the command from the controller 22. In this manner, the memory circuit 20 selects the memory cell MC in each of the plurality of memory cell arrays MA by selecting the word line WL and the bit line BL, and applies the voltage generated by the voltage generator 32 to the selected memory cell MC. In the memory cell MC to which the blow voltage is applied, the tunnel barrier layer T of the memory element M is broken, and the resistance state of the memory element M becomes the resistance state RS. In the memory cell MC to which the ground voltage is applied, the resistance state of the memory element M is maintained to the resistance state RL. In this manner, the memory circuit 20 writes information to the selected memory cell MC.

In addition, the controller 22 of the memory circuit 20 controls the operations of the word line driver 21 and the plurality of reader writers IO to read information from the memory cell MC of the plurality of memory cell arrays MA, on the basis of the read command supplied from the processing circuit 11. In the read operation, the word line driver 21 selects one of the plurality of word lines WL, on the basis of the command from the controller 22. In each of the plurality of reader writers IO, the column switch 31 selects one of the plurality of bit lines BL and couples the selected bit line BL to the sense amplifier 33, and places other bit lines into the floating state, on the basis of the command from the controller 22. The sense amplifier 33 generates the read voltage Vread to be applied to the selected bit line BL, on the basis of the command from the controller 22. The driver 34 drives the voltage line VL, on the basis of the command from the controller 22. Further, the sense amplifier 33 reads information stored in the memory cell MC, on the basis of the current flowing through the selected bit line BL. Thus, the memory circuit 20 selects the memory cell MC in each of the plurality of memory cell arrays MA by selecting the word line WL and the bit line BL, and reads information stored in the selected memory cell MC.

(Detailed Operation)

Figure 5:
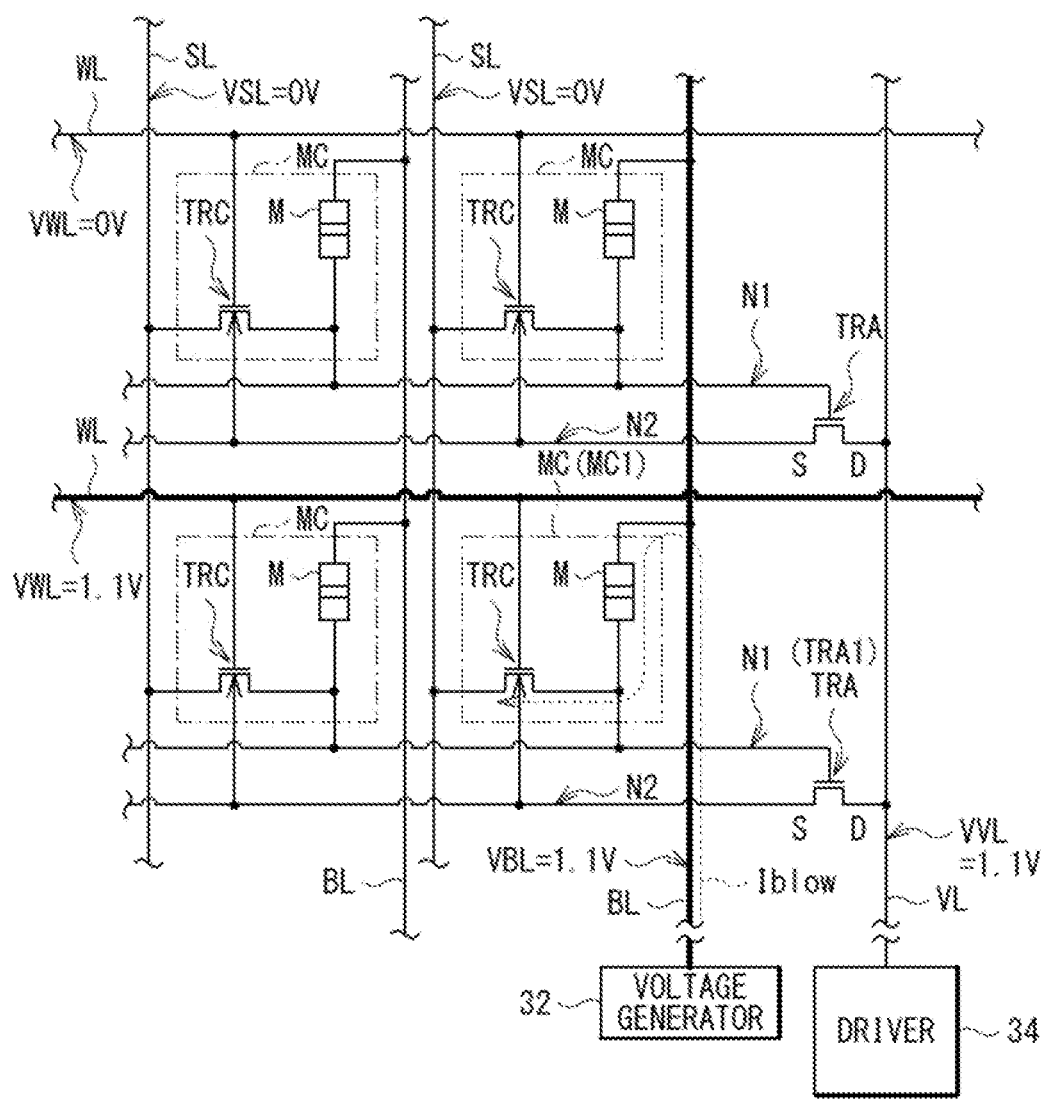
FIG. 5 is an explanatory diagram illustrating an example of a write operation in the memory circuit illustrated in FIG. 2.

FIG. 5 illustrates an example of the write operation in the memory circuit 20. In this example, the controller 22 controls the operations of the word line driver 21 and the plurality of reader writers IO to select a certain memory cell MC (a memory cell MC1) of the plurality of memory cells MC in each of the plurality of memory cell arrays MA, on the basis of the write command and the write data supplied from the processing circuit 11 (FIG. 1).

The word line driver 21 selects one of the plurality of word lines WL, on the basis of the command from the controller 22. Specifically, the word line driver 21 sets a voltage VWL of the word line WL relating to the memory cell MC1 among the plurality of word lines WL to 1.1 V (VWL=1.1 V), and sets the voltage VWL of other word lines WL to 0 V (VWL=0 V). In FIG. 5, the selected word line WL is indicated by a thick line. Thus, the transistors TRC of the plurality of memory cells MC corresponding to one row that are coupled to the selected word line WL are set to an ON state.

In the reader writer IO, the column switch 31 selects the bit line BL relating to the memory cell MC1 among the plurality of bit lines BL and couples the selected bit line BL to the voltage generator 32, on the basis of the command from the controller 22. In FIG. 5, the selected bit line BL is indicated by a thick line. The voltage generator 32 generates the blow voltage in this example, on the basis of the command from the controller 22. In this example, the blow voltage is 1.1 V. Thus, the reader writer 10 sets a voltage VBL of the selected bit line BL to 1.1 V (VBL=1.1 V). In addition, the reader writer 10 places the bit lines BL other than the selected bit line BL among the plurality of bit lines BL into the floating state. Further, the driver 34 sets a voltage VVL of the voltage line VL to 1.1 V (VVL=1.1 V), on the basis of the command from the controller 22.

Accordingly, a blow current Iblow flows from the voltage generator 32 through the bit line BL to the memory cell MC1. In the memory cell MC1, the blow current Iblow flows in the order of the bit line BL, the memory element M, the transistor TRC, and the source line SL.

In the memory cell MC1, the blow voltage (1.1 V) applied to the bit line BL is subjected to a voltage division by the resistance value of the memory element M and an ON resistance of the transistor TRC to generate a voltage at the node N1. Because 1.1 V is applied to the drain of the transistor TRA (a transistor TRA1) associated with the memory cell MC1, a voltage of the source of the transistor TRA1 becomes higher than 0 V. Thus, a voltage of the back gate of the transistor TRC of the memory cell MC1 becomes higher, so that the ON resistance of the transistor TRC becomes lower. The blow current Iblow becomes easier to flow as the ON resistance of the transistor TRC becomes lower in this manner. Accordingly, the tunnel barrier layer T of the memory element M is broken and the resistance state of the memory element M becomes the resistance state RS, allowing information to be stored in the memory cell MC1.

In this example, the voltage generator 32 generates the blow voltage on the basis of the command from the controller 22. However, in a case where the voltage generator 32 generates the ground voltage, the reader writer IO sets the voltage VBL of the selected bit line BL to 0 V. In this case, the tunnel barrier layer T of the memory element M is not broken because no blow current Iblow flows to the memory cell MC1. Accordingly, the resistance state of the memory element M is maintained to the resistance state RL.

The 32 reader writers IO thus write 32-bit data to the 32 memory cells MC in the 32 memory cell arrays MA.

Figure 6:
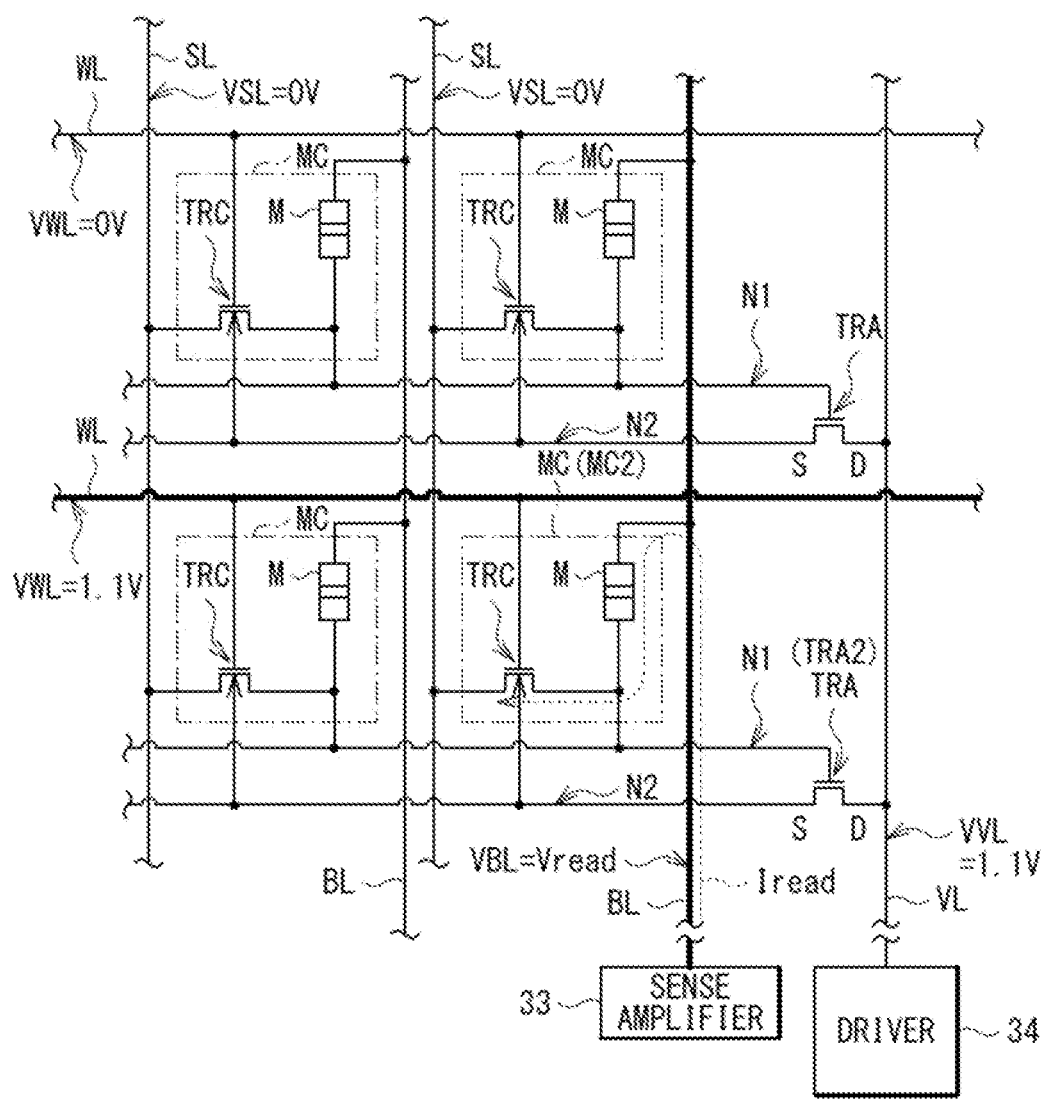
FIG. 6 is an explanatory diagram illustrating an example of a read operation in the memory circuit illustrated in FIG. 2.

FIG. 6 illustrates an example of the read operation in the memory circuit 20. In this example, the controller 22 controls the operations of the word line driver 21 and the plurality of reader writers 10 to select a certain memory cell MC (a memory cell MC2) of the plurality of memory cells MC in each of the plurality of memory cell arrays MA, on the basis of the read command supplied from the processing circuit 11 (FIG. 1).

The word line driver 21 selects one of the plurality of word lines WL, on the basis of the command from the controller 22. Specifically, the word line driver 21 sets the voltage VWL of the word line WL relating to the memory cell MC2 among the plurality of word lines WL to 1.1 V (VWL=1.1 V), and sets the voltage VWL of other word lines WL to 0 V (VWL=0 V). Thus, the transistors TRC of the plurality of memory cells MC corresponding to one row that are coupled to the selected word line WL are set to the ON state.

In the reader writer TO, the column switch 31 selects the bit line BL relating to the memory cell MC1 among the plurality of bit lines BL and couples the selected bit line BL to the sense amplifier 33, on the basis of the command from the controller 22. The sense amplifier 33 generates the read voltage Vread, on the basis of the command from the controller 22. Thus, the reader writer IO sets the voltage VBL of the selected bit line BL to the read voltage Vread (VBL=Vread). In addition, the reader writer IO places the bit lines BL other than the selected bit line BL among the plurality of bit lines BL into the floating state. Further, the driver 34 sets the voltage VVL of the voltage line VL to 1.1 V (VVL=1.1 V), on the basis of the command from the controller 22.

Accordingly, a read current Iread flows from the sense amplifier 33 through the bit line BL to the memory cell MC2. In the memory cell MC2, the read current Iread flows in the order of the bit line BL, the memory element M, the transistor TRC, and the source line SL.

In the memory cell MC2, the read voltage Vread applied to the bit line BL is subjected to a voltage division by the resistance value of the memory element M and the ON resistance of the transistor TRC to generate a voltage at the node N1. Because 1.1 V is applied to the drain of the transistor TRA (a transistor TRA2) associated with the memory cell MC2, a voltage of the source of the transistor TRA2 becomes higher than 0 V. Thus, a voltage of the back gate of the transistor TRC of the memory cell MC2 becomes higher, so that the ON resistance of the transistor TRC becomes lower. In a case where the ON resistance of the transistor TRC thus becomes lower, the read current Iread more reflects the resistance state of the memory element M. On the basis of the read current Iread, the sense amplifier 33 reads information stored in the memory cell MC2 by determining whether the resistance state of the memory element M is the resistance state RL or the resistance state RS.

The 32 reader writers IO thus read 32-bit data from the 32 memory cells MC in the 32 memory cell arrays MA.

As described above, in the semiconductor circuit 1, the transistor TRA is provided, the gate of the transistor TRA is coupled to the other end of the memory element M and the drain of the transistor TRC, and the source of the transistor TRA is coupled to the back gate of the transistor TRC. Thus, it is possible to control the voltage of the back gate of the transistor TRC. Hence, it is possible to lower the ON resistance of the transistor TRC.

By reducing the ON resistance of the transistor TRC in this way, it is possible, for example, in the write operation, to make the blow current Iblow easier to flow and to make the tunnel barrier layer T of the memory element M easier to be broken. Hence, it is possible to widen a so-called blow margin in the semiconductor circuit 1.

In particular, as a miniaturization progresses in a manufacturing process, variations in the resistance value of the memory element M can make the memory element M difficult to be broken. Specifically, in general, it becomes difficult to break the memory element M in a case where the resistance value in the resistance state RL of the memory element M is low. In the semiconductor circuit 1, the voltage of the node N1 may become high in a case where the resistance value in the resistance state RL of the memory element M is low. In this case, the voltage of the gate of the transistor TRA becomes high and the voltage of the back gate of the transistor TRC becomes high, making it possible to lower the ON resistance of the transistor TRC. Thus, it is possible to make the blow current Iblow easier to flow and to make the tunnel barrier layer T of the memory element M easier to be broken.

In addition, because it is possible to lower the ON resistance of the transistor TRC in this manner, it is possible to reduce a size of the transistor TRC. In general, the ON resistance of the transistor TRC is increased in a case where the size of the transistor TRC is reduced, making it difficult to break the memory element M. In the semiconductor circuit 1, the voltage of the node N1 may become high as the ON resistance of the transistor TRC becomes high. The voltage of the back gate of the transistor TRC becomes high in a case where the voltage of the node N1 becomes high in this manner, making it possible to lower the ON resistance of the transistor TRC and making it easier to break the memory element M. As described above, in the semiconductor circuit 1, it is possible to reduce the size of the transistor TRC and thereby to reduce the size of the memory cell MC.

In addition, because it is possible to lower the ON resistance of the transistor TRC in this manner, it is possible, for example, in the write operation, to lower the blow voltage. That is, for example, in a case where the ON resistance of the transistor TRC is high, a high blow voltage can be used to break the memory element M more reliably. In such a case, for example, a high voltage is applied to the transistor TRC, which can lower the reliability of the transistor TRC. In contrast, in the semiconductor circuit 1, it is possible to lower the blow voltage and thereby to reduce a possibility that the reliability of the transistor TRC is lowered. In addition, in the semiconductor circuit 1, it is not necessary to provide a charge pump circuit or the like that generates a high blow voltage, allowing the size of the memory circuit 20 to be reduced.

In addition, by reducing the ON resistance of the transistor TRC, for example, in the read operation, the read current tread more reflects the resistance state of the memory element M. Thus, it makes it easier to determine whether the resistance state of the memory element M is the resistance state RL or the resistance state RS on the basis of the read current tread. Hence, it is possible to widen a so-called read margin.

In addition, in the semiconductor circuit 1, one transistor TRA is provided for the plurality of memory cells MC corresponding to one row. Thus, it is possible to suppress the number of elements as compared with, for example, a case where one transistor TRA is provided for one memory cell MC. Hence, it is possible to reduce the size of the memory circuit 20.

In addition, in the semiconductor circuit 1, the plurality of transistors TRC in the plurality of memory cells MC corresponding to one row is formed on one P-well. Hence, for example, it is possible to reduce the size of the memory circuit 20 as compared with a case where the plurality of transistors TRC is respectively formed on the plurality of P-wells.

In addition, in the semiconductor circuit 1, the memory element M having the same configuration as the memory element M of the memory circuit 12 is used to configure the memory circuit 20. Thus, it is possible to form the memory circuit 12 configured to rewrite information and the memory circuit 20 configured to write information once in the same manufacturing process. Hence, it is possible to perform manufacturing in a simple method and reduce manufacturing costs.

[Effects]

As described above, in the present embodiment, the transistor TRA is provided, the gate of the transistor TRA is coupled to the other end of the memory element M and the drain of the transistor TRC, and the source of the transistor TRA is coupled to the back gate of the transistor TRC. Thus, it is possible to lower the ON resistance of the transistor TRC. Hence, for example, it is possible to reduce the size of the memory cell and to reduce the possibility that the reliability is lowered. Accordingly, for example, it is possible to widen the blow margin and widen the read margin.

Modification Example 1

In the embodiment described above, the driver 34 sets the voltage VVL of the voltage line VL to 1.1 V in the read operation, as illustrated in FIG. 6. However, it is not limited thereto. Alternatively, for example, the voltage VVL of voltage line VL may be set to 0 V.

Modification Example 2

Figure 7:
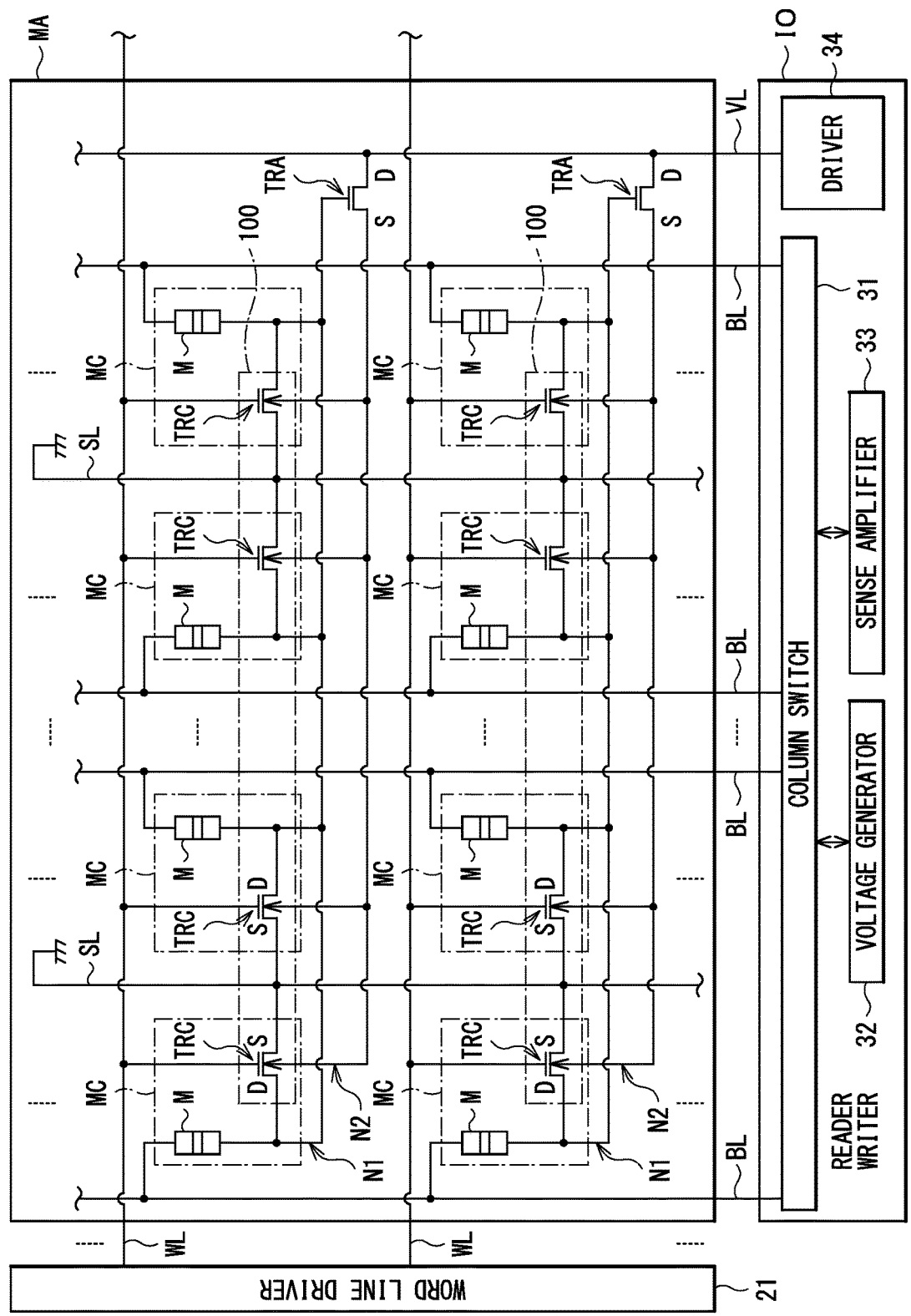
FIG. 7 is a circuit diagram illustrating a configuration example of a memory circuit according to a modification example.

In the embodiment described above, one source line SL is provided for the plurality of memory cells MC corresponding to one column. However, it is not limited thereto. Alternatively, for example, one source line SL may be provided for the plurality of memory cells MC corresponding to two columns, as in a memory circuit 20A illustrated in FIG. 7. In this example, the plurality of memory cells MC in the first column and the plurality of memory cells MC in the second column are coupled to one source line SL. Further, the plurality of memory cells MC in the third column and the plurality of memory cells MC in the fourth column are coupled to one source line SL. This applies similarly to the fifth and subsequent columns.

Modification Example 3

In the embodiment described above, one bit information is stored in one memory cell MC. However, it is not limited thereto. One bit information may be stored in two memory cells MC. Hereinafter, a semiconductor circuit 1C according to the present modification example will be described in detail. The semiconductor circuit 1C includes a memory circuit 40.

Figure 8:
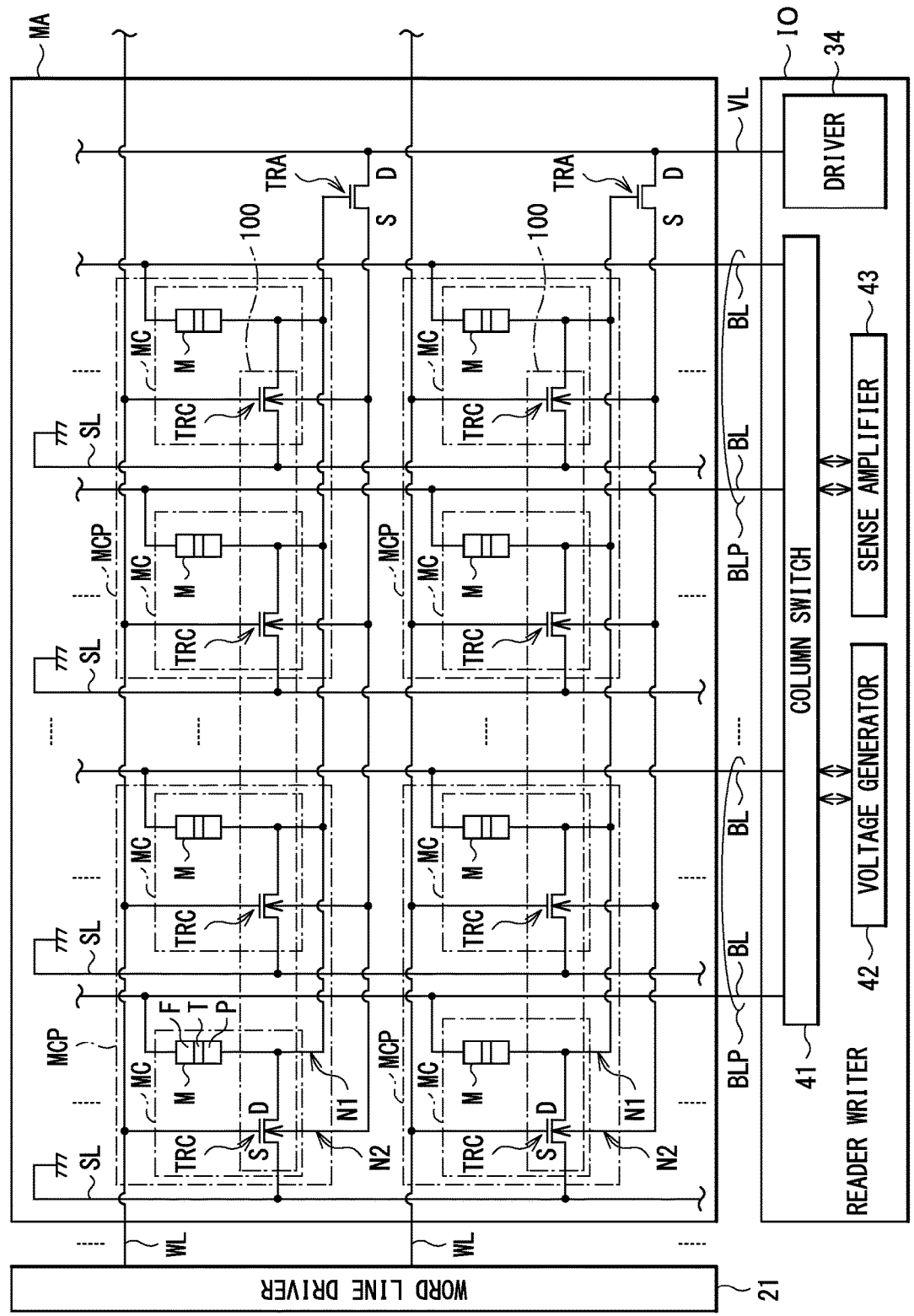
FIG. 8 is a circuit diagram illustrating a configuration example of a memory circuit according to another modification example.

FIG. 8 illustrates a configuration example of the memory cell array MA and the reader writer IO according to the memory circuit 40. In the memory cell array MA, two memory cells MC coupled to the same word line WL structure a memory cell pair MCP. In this example, for example, the memory cell MC in the first column and the memory cell MC in the second column structure the memory cell pair MCP, and the memory cell MC in the third column and the memory cell MC in the fourth column structure the memory cell pair MCP. This applies similarly to the fifth and subsequent columns. Similarly, the two bit lines BL structure a bit line pair BLP. Specifically, the first bit line BL and the second bit line BL structure the bit line pair BLP, and the third bit line BL and the fourth bit line BL structure the bit line pair BLP. This applies similarly to the fifth and subsequent bit lines.

In the memory circuit 40, after the write operation, the resistance state of the memory element M of the left side memory cell MC in the memory cell pair MCP is different from the resistance state of the memory element of the right side memory cell MC. Specifically, in a case where the resistance state of the memory element M of the left side memory cell MC is the resistance state RS, the resistance state of the memory element M of the right side memory cell MC is the resistance state RL. In a case where the resistance state of the memory element M of the left side memory cell MC is the resistance state RL, the resistance state of the memory element M of the right side memory cell MC is the resistance state RS. In this manner, the memory cell pair MCP stores one-bit information.

The reader writer IO includes a column switch 41, a voltage generator 42, and a sense amplifier 43.

The column switch 41 is configured to, in the write operation, select one of the plurality of bit line pairs BLP and couple the selected bit line pair BLP to the voltage generator 42, and place each of the bit lines BL of other bit line pairs BLP into the floating state, on the basis of the command from the controller 22. Further, the column switch 41 is configured to, in the read operation, select one of the plurality of bit line pairs BLP and couple the selected bit line pair BLP to the sense amplifier 43, and place each of the bit lines BL of other bit line pairs BLP into the floating state, on the basis of the command from the controller 22.

The voltage generator 42 is configured to, in the write operation, generate the ground voltage and the blow voltage to be applied to each of the bit lines BL of the selected bit line pair BLP, on the basis of the command from the controller 22.

The sense amplifier 43 is configured to, in the read operation, generate the read voltage Vread to be applied to each of the bit lines BL of the selected bit line pair BLP and read information stored in the memory cell pair MCP on the basis of a current flowing through each of the bit lines BL of the selected bit line pair BLP, on the basis of the command from the controller 22.

Figure 9:
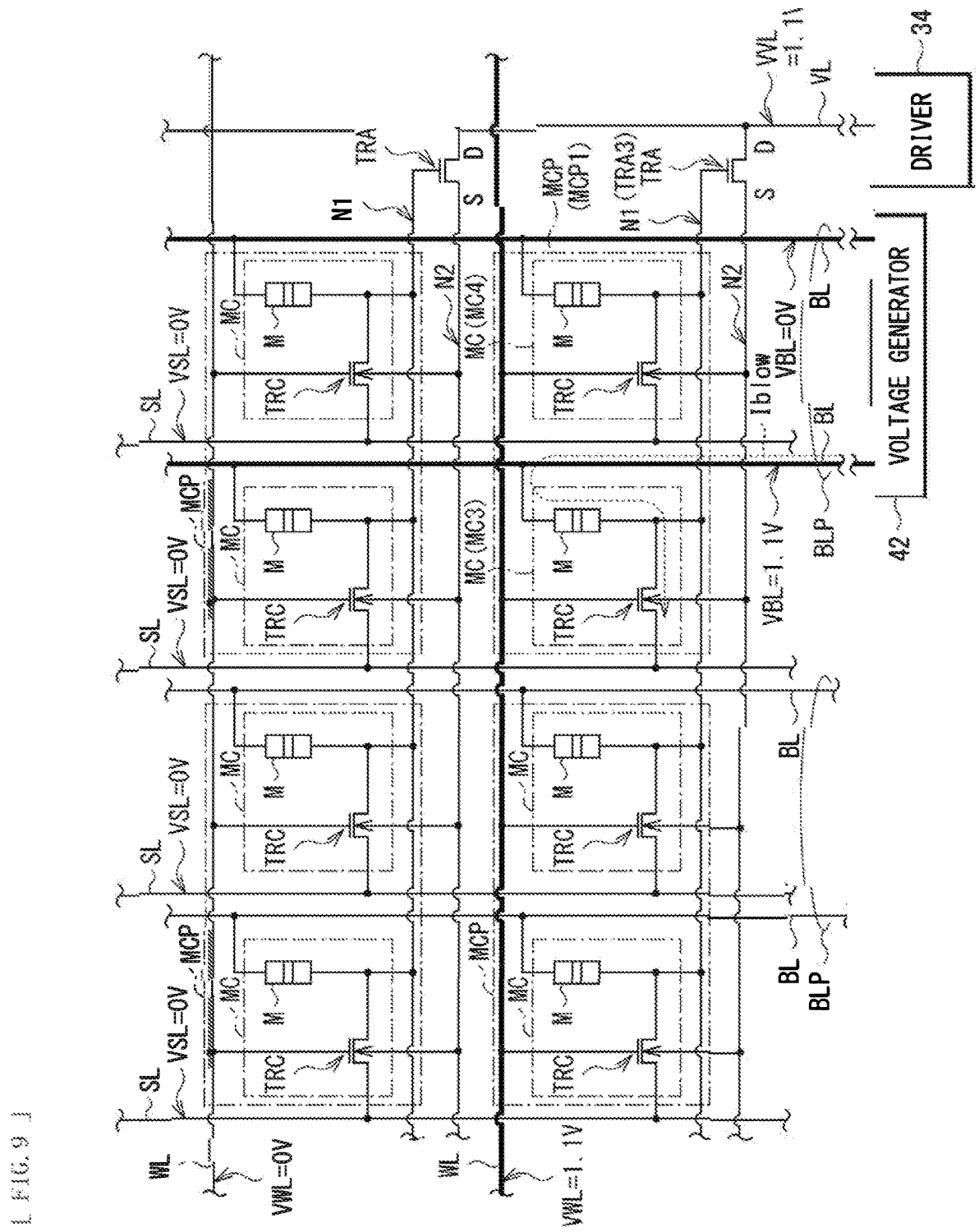
FIG. 9 is an explanatory diagram illustrating an example of the write operation in the memory circuit illustrated in FIG. 8.

FIG. 9 illustrates an example of the write operation in the memory circuit 40. In this example, the controller 22 controls the operations of the word line driver 21 and the plurality of reader writers IO to select a certain memory cell pair MCP (a memory cell pair MCP1) of the plurality of memory cell pairs MCP in each of the plurality of memory cell arrays MA, on the basis of the write command and the write data supplied from the processing circuit 11.

The word line driver 21 selects one of the plurality of word lines WL, on the basis of the command from the controller 22. Specifically, the word line driver 21 sets the voltage VWL of the word line WL relating to the memory cell pair MCP1 among the plurality of word lines WL to 1.1 V (VWL=1.1 V), and sets the voltage VWL of other word lines WL to 0 V (VWL=0 V). Thus, the transistors TRC of the plurality of memory cells MC corresponding to one row that are coupled to the selected word line WL are set to the ON state.

In the reader writer IO, the column switch 41 selects the bit line pair BLP relating to the memory cell pair MCP1 among the plurality of bit line pairs BLP and couples two bit lines BL of the selected bit line pair BLP to the voltage generator 42, on the basis of the command from the controller 22. The voltage generator 42 generates the ground voltage (0 V) and the blow voltage (1.1 V in this example), on the basis of the command from the controller 22. Thus, in this example, the reader writer IO sets the voltage VBL of the left side bit line BL to 1.1 V (VBL=1.1 V) and the voltage VBL of the right side bit line BL to 0V (VBL=0 V), out of the two bit lines BL of the selected bit line pair BLP. In addition, the reader writer IO places the bit lines BL other than the bit lines BL of the selected bit line pair BLP among the plurality of bit lines BL into the floating state. Further, the driver 34 sets the voltage VVL of the voltage line VL to 1.1 V (VVL=1.1 V), on the basis of the command from the controller 22.

Accordingly, the blow current Iblow flows from the voltage generator 42 through the left side bit line BL of the selected bit line pair BLP to the left side memory cell MC (a memory cell MC3) of the memory cell pair MCP1. In the memory cell MC3, the blow current Iblow flows in the order of the bit line BL, the memory element M, the transistor TRC, and the source line SL. The transistor TRA (a transistor TRA3) associated with the memory cell pair MCP1 raises the voltage of the back gate of the transistor TRC of the memory cell MC3 so that the ON resistance of the transistor TRC becomes lower, making it easier for the blow current Iblow to flow. Thus, the resistance state of the memory element M of the memory cell MC3 becomes the resistance state RS. On the other hand, because no blow current Iblow flows to the right side memory cell MC (a memory cell MC4) of the memory cell pair MCP1, the tunnel barrier layer T of the memory element M is not broken. Accordingly, the resistance state of the memory element M of the memory cell MC4 is maintained to the resistance state RL. In this manner, information is stored in the memory cell pair MCP1.

Note that, in this example, the reader writer IO sets the voltage VBL of the left side bit line BL to 1.1 V (VBL=1.1 V) and the voltage VBL of the right side bit line BL to 0 V (VBL=0 V), out of the two bit lines BL of the selected bit line pair BLP. Alternatively, in a case where the reader writer IO sets the voltage VBL of the left side bit line BL to 0 V (VBL=0 V) and the voltage VBL of the right side bit line BL to 1.1 V (VBL=1.1 V), the resistance state of the memory element M of the memory cell MC4 becomes the resistance state RS, and the resistance state of the memory element M of the memory cell MC3 is maintained to the resistance state RL.

The 32 reader writers IO thus write 32-bit data to the 32 memory cell pairs MCP in the 32 memory cell arrays MA.

FIG. 10 illustrates an example of the read operation in the memory circuit 40. In this example, the controller 22 controls the operations of the word line driver 21 and the plurality of reader writers IO to select a certain memory cell pair MCP (a memory cell pair MCP2) of the plurality of memory cell pairs MCP in each of the plurality of memory cell arrays MA, on the basis of the read command supplied from the processing circuit 11.

The word line driver 21 selects one of the plurality of word lines WL, on the basis of the command from the controller 22. Specifically, the word line driver 21 sets the voltage VWL of the word line WL relating to the memory cell pair MCP2 among the plurality of word lines WL to 1.1 V (VWL=1.1 V), and sets the voltage VWL of other word lines WL to 0 V (VWL=0 V). Thus, the transistors TRC of the plurality of memory cells MC corresponding to one row that are coupled to the selected word line WL are set to the ON state.

In the reader writer IO, the column switch 41 selects the bit line pair BLP relating to the memory cell pair MCP2 among the plurality of bit line pairs BLP and couples two bit lines BL of the selected bit line pair BLP to the sense amplifier 43, on the basis of the command from the controller 22. The sense amplifier 43 generates the read voltage Vread, on the basis of the command from the controller 22. Thus, the reader writer IO sets the voltage VBL of the two bit lines BL of the selected bit line pair BLP to the read voltage Vread (VBL=Vread). In addition, the reader writer IO places the bit lines BL other than the bit lines BL of the selected bit line pair BLP among the plurality of bit lines BL into the floating state. Further, the driver 34 sets the voltage VVL of the voltage line VL to 1.1 V (VVL=1.1 V), on the basis of the command from the controller 22.

Accordingly, from the sense amplifier 43, a read current Iread5 flows through the left side bit line BL of the selected bit line pair BLP to the left side memory cell MC (a memory cell MC5) of the memory cell pair MCP2, and a read current Iread6 flows through the right side bit line BL of the selected bit line pair BLP to the right side memory cell MC (a memory cell MC6) of the memory cell pair MCP2. The transistor TRA (a transistor TRA4) associated with the memory cell pair MCP2 raises the voltage of the back gates of the transistors TRC of the memory cells MC5 and MC6, so that the ON resistance of the transistors TRC of the memory cells MC5 and MC6 becomes lower. Thus, the read current Iread5 more reflects the resistance state of the memory element M of the memory cell MC5, and the read current Iread6 more reflects the resistance state of the memory element M of the memory cell MC6. On the basis of the read currents Iread5 and Iread6, the sense amplifier 33 reads information stored in the memory cell pair MCP2, for example, by determining which of the resistance value of the memory element M of the memory cell MC5 and the resistance value of the memory element M of the memory cell MC6 is greater.

The 32 reader writers IO thus read 32-bit data from the 32 memory cell pairs MCP in the 32 memory cell arrays MA.

As described above, although the present modification example is applied to the memory circuit 20 (FIG. 3) according to the embodiment described above, it is not limited thereto. For example, as illustrated in FIG. 11, the present modification example may be applied to the memory circuit 20A (FIG. 7) according to the modification example 2.

Modification Example 4

Although the source lines SL are grounded in the embodiment described above, it is not limited thereto. The source lines SL may be selectively driven. Hereinafter, a semiconductor circuit 1D according to the present modification example will be described in detail. The semiconductor circuit 1D includes a memory circuit 50.

FIG. 12 illustrates a configuration example of the memory circuit 50. The memory circuit 50 has the plurality of memory cell arrays MA (32 memory cell arrays MA[0], MA[1], . . . , MA[31], in this example), the plurality of reader writers IO (32 reader writers IO[0], . . . , IO[31], in this example), a plurality of source line drivers DRV (32 source line drivers DRV[0], DRV[1], DRV[31], in this example), the word line driver 21, and a controller 52. The plurality of source line drivers DRV is respectively provided corresponding to the plurality of memory cell arrays MA.

FIG. 13 illustrates a configuration example of the source line driver DRV. In FIG. 13, the memory cell array MA, the reader writer IO, and the word line driver 21 are also depicted for convenience of explanation. The source line driver DRV is configured to drive the plurality of source lines SL on the basis of a command from the controller 52. The source line driver DRV has a column switch 61 and a voltage generator 62.

The column switch 61 is configured to, in the write operation and the read operation, select one of the plurality of source lines SL and couple the selected source line SL to the voltage generator 62, and place other source lines SL into the floating state, on the basis of the command from the controller 52. The column switches 61 of the plurality of source line drivers DRV are adapted to select the source lines SL that are the same as each other in number of order, on the basis of the command from the controller 52.

The voltage generator 62 is configured to, in the write operation and the read operation, generate the ground voltage to be applied to the selected source line SL, on the basis of the command from the controller 52.

The controller 52 (FIG. 12) is configured to control operations of the word line driver 21, the plurality of source line drivers DRV, and the plurality of reader writers IO to write information to the memory cell MC of the plurality of memory cell arrays MA, on the basis of the write command and the write data supplied from the processing circuit 11. Further, the controller 52 is configured to control operations of the word line driver 21, the plurality of source line drivers DRV, and the plurality of reader writers IO to read information from the memory cell MC of the plurality of memory cell arrays MA, on the basis of the read command supplied from the processing circuit 11.

FIG. 14 illustrates an example of the write operation in the memory circuit 50. In this example, the controller 52 controls the operations of the word line driver 21, the plurality of source line drivers DRV, and the plurality of reader writers 10 to select a certain memory cell MC (a memory cell MC7) of the plurality of memory cells MC in each of the plurality of memory cell arrays MA, on the basis of the write command and the write data supplied from the processing circuit 11 (FIG. 1).

The word line driver 21 selects one of the plurality of word lines WL, on the basis of the command from the controller 52. Specifically, the word line driver 21 sets the voltage VWL of the word line WL relating to the memory cell MC7 among the plurality of word lines WL to 1.1 V (VWL=1.1 V), and sets the voltage VWL of other word lines WL to 0 V (VWL=0 V). Thus, the transistors TRC of the plurality of memory cells MC corresponding to one row that are coupled to the selected word line WL are set to the ON state.

In the source line driver DRV, the column switch 61 selects the source line SL relating to the memory cell MC7 among the plurality of source lines SL and couples the selected source line SL to the voltage generator 62, on the basis of the command from the controller 52. In FIG. 14, the selected source line SL is indicated by a thick line. The voltage generator 62 generates the ground voltage in this example, on the basis of the command from the controller 52. Thus, the source line driver DRV sets a voltage VSL of the selected source line SL to 0 V (VBL=0 V). In addition, the source line driver DRV places the source lines SL other than the selected source line SL among the plurality of source lines SL into the floating state.

In the reader writer IO, the column switch 31 selects the bit line BL relating to the memory cell MC7 among the plurality of bit lines BL and couples the selected bit line BL to the voltage generator 32, on the basis of the command from the controller 52. The voltage generator 32 generates the blow voltage (in this example, 1.1 V) in this example, on the basis of the command from the controller 52. Thus, the reader writer IO sets the voltage VBL of the selected bit line BL to 1.1 V (VBL=1.1 V). In addition, the reader writer IO places the bit lines BL other than the selected bit line BL among the plurality of bit lines BL into the floating state. Further, the driver 34 sets the voltage VVL of the voltage line VL to 1.1 V (VVL=1.1 V), on the basis of the command from the controller 52.

Accordingly, the blow current Iblow flows from the voltage generator 32 through the bit line BL to the memory cell MC1. In the memory cell MC7, the blow current Iblow flows in the order of the bit line BL, the memory element M, the transistor TRC, and the source line SL. The transistor TRA (a transistor TRA7) associated with the memory cell MC7 raises the voltage of the back gate of the transistor TRC of the memory cell MC7 so that the ON resistance of the transistor TRC becomes lower, making it easier for the blow current Iblow to flow. Thus, the resistance state of the memory element M of the memory cell MC7 becomes the resistance state RS.

FIG. 15 illustrates an example of the read operation in the memory circuit 50. In this example, the controller 52 controls the operations of the word line driver 21, the plurality of source line drivers DRV, and the plurality of reader writers IO to select a certain memory cell MC (a memory cell MC8) of the plurality of memory cells MC in each of the plurality of memory cell arrays MA, on the basis of the read command supplied from the processing circuit 11.

The word line driver 21 selects one of the plurality of word lines WL, on the basis of the command from the controller 52. Specifically, the word line driver 21 sets the voltage VWL of the word line WL relating to the memory cell MC8 among the plurality of word lines WL to 1.1 V (VWL=1.1 V), and sets the voltage VWL of other word lines WL to 0 V (VWL=0 V). Thus, the transistors TRC of the plurality of memory cells MC corresponding to one row that are coupled to the selected word line WL are set to the ON state.

In the source line driver DRV, the column switch 61 selects the source line SL relating to the memory cell MC8 among the plurality of source lines SL and couples the selected source line SL to the voltage generator 62, on the basis of the command from the controller 52. The voltage generator 62 generates the ground voltage in this example, on the basis of the command from the controller 52. Thus, the source line driver DRV sets the voltage VSL of the selected source line SL to 0 V (VBL=0 V). In addition, the source line driver DRV places the source lines SL other than the selected source line SL among the plurality of source lines SL into the floating state.

In the reader writer IO, the column switch 31 selects the bit line BL relating to the memory cell MC8 among the plurality of bit lines BL and couples the selected bit line BL to the sense amplifier 33, on the basis of the command from the controller 52. The sense amplifier 33 generates the read voltage Vread, on the basis of the command from the controller 52. Thus, the reader writer IO sets the voltage VBL of the selected bit line BL to the read voltage Vread (VBL=Vread). In addition, the reader writer IO places the bit lines BL other than the selected bit line BL among the plurality of bit lines BL into the floating state. Further, the driver 34 sets the voltage VVL of the voltage line VL to 1.1 V (VVL=1.1 V), on the basis of the command from the controller 52.

Accordingly, the read current Iread flows from the sense amplifier 33 through the bit line BL to the memory cell MC8. In the memory cell MC8, the read current Iread flows in the order of the bit line BL, the memory element M, the transistor TRC, and the source line SL. The transistor TRA (a transistor TRA8) associated with the memory cell MC8 raises the voltage of the back gate of the transistor TRC of the memory cell MC8, so that the ON resistance of the transistor TRC becomes lower. Thus, the read current Iread more reflects the resistance state of the memory element M of the memory cell MC8. On the basis of the read current Iread, the sense amplifier 33 reads information stored in the memory cell MC8 by determining whether the resistance state of the memory element M is the resistance state RL or the resistance state RS.

As described above, although the memory circuit 20 (FIG. 3) according to the embodiment described above is applied to the present modification example, it is not limited thereto. For example, as illustrated in FIG. 16, the present modification example may be applied to the memory circuit 20A (FIG. 7) according to the modification example 2. The source line driver DRV has a column switch 71. The column switch 71 is configured to, in the write operation and the read operation, select one of the plurality of source lines SL and couple the selected source line SL to the voltage generator 62, and place other source lines SL into the floating state, on the basis of the command from the controller 52.

OTHER MODIFICATION EXAMPLES

In addition, two or more of the modification examples described above may be combined.

2. Application Example

Next, an application example of a technique described in the above embodiment and modification examples to an electronic apparatus will be described.

FIG. 17 illustrates an external appearance of a smartphone to which the semiconductor circuit of the above embodiment or the like is applied. The smartphone includes, for example, a body section 310 and a display section 320. It is possible to apply the semiconductor circuit of the above embodiment or the like to an electronic apparatus in various fields, such as a digital camera, a notebook personal computer, a portable gaming machine, a video camera, and the like, in addition to the smartphone.

Although the present technology has been described above with reference to the embodiment, the modification examples, and the application example to the electronic apparatus, the present technology is not limited to the embodiment and the like, and various modifications can be made.

For example, in each of the embodiments described above, the transistors TRC and TRA are each configured using the N-type MOS transistor. However, it is not limited thereto. Alternatively, for example, a P-type MOS transistor may be used to configure the transistors TRC and TRA.

It is to be noted that the effects described in the present specification are merely illustrative and non-limiting, and other effects may be provided.

It should be noted that the present technology may be configured as below. According to the present technology having the following configuration, it is possible to reduce a size of a memory cell.

(1) A semiconductor circuit including:
a first memory element including a first terminal, a second terminal coupled to a first node, and a tunnel barrier film, and configured to store information by breaking the tunnel barrier film;
a first transistor including a drain coupled to the first node, a source, a gate, and a back gate coupled to a second node; and
a second transistor including a drain, a source coupled to the second node, and a gate coupled to the first node.

(2) The semiconductor circuit according to (1), further including a driver configured to perform a first operation that causes the first memory element to store the information, by applying a reference voltage to the source of the first transistor, applying a first voltage that is different from the reference voltage to the gate of the first transistor, applying a second voltage that is different from the reference voltage to the first terminal of the first memory element, and applying a third voltage that is different from the reference voltage to the drain of the second transistor.

(3) The semiconductor circuit according to (2), in which the driver is further configured to perform a second operation that reads the information from the first memory element, by applying the reference voltage to the source of the first transistor, applying the first voltage to the gate of the first transistor, and applying a fourth voltage that is different from the reference voltage to the first terminal of the first memory element.

(4) The semiconductor circuit according to (3), in which a difference voltage between the fourth voltage and the reference voltage is lower than a difference voltage between the second voltage and the reference voltage.

(5) The semiconductor circuit according to (3) or (4), in which the driver is configured to apply the third voltage to the drain of the second transistor in the second operation.

(6) The semiconductor circuit according to (3) or (4), in which the driver is configured to apply the reference voltage to the drain of the second transistor in the second operation.

(7) The semiconductor circuit according to (1), further including:
a second memory element including a first terminal, a second terminal coupled to the first node, and a tunnel barrier film, and configured to store information by breaking the tunnel barrier film;
a third transistor including a drain coupled to the first node, a source, a gate, and a back gate coupled to the second node;
a first control line coupled to the gate of the first transistor and the gate of the third transistor;
a second control line coupled to the first terminal of the first memory element;
a third control line coupled to the first terminal of the second memory element; and
a fourth control line coupled to the drain of the second transistor.

(8) The semiconductor circuit according to (7), further including:
a fifth control line coupled to the source of the first transistor; and
a driver configured to perform a first operation that causes the first memory element to store the information, by applying a reference voltage to the fifth control line, applying a first voltage that is different from the reference voltage to the first control line, applying a second voltage that is different from the reference voltage to the second control line, placing the third control line into a floating state, and applying a third voltage that is different from the reference voltage to the fourth control line.

(9) The semiconductor circuit according to (8), further including
a sixth control line coupled to the source of the third transistor, in which
the driver is configured to apply the reference voltage to the sixth control line in the first operation.

(10) The semiconductor circuit according to (8), further including
a sixth control line coupled to the source of the third transistor, in which
the driver is configured to place the sixth control line into the floating state in the first operation.

(11) The semiconductor circuit according to (8), in which the fifth control line is further coupled to the source of the third transistor.

(12) The semiconductor circuit according to any one of (8) to (11), in which the driver is further configured to perform a second operation that reads the information from the first memory element, by applying the reference voltage to the fifth control line, applying the first voltage to the first control line, applying a fourth voltage that is different from the reference voltage to the second control line, and placing the third control line into the floating state.

(13) The semiconductor circuit according to claim 1, in which the tunnel barrier film includes a material including MgO or alumina.

(14) The semiconductor circuit according to any one of (1) to (13), further including a memory circuit including a magnetic tunnel junction device having a tunnel barrier film.

(15) An electronic apparatus including:
a first memory element including a first terminal, a second terminal coupled to a first node, and a tunnel barrier film, and configured to store information by breaking the tunnel barrier film;
a first transistor including a drain coupled to the first node, a source, a gate, and a back gate coupled to a second node;
a second transistor including a drain, a source coupled to the second node, and a gate coupled to the first node; and
a processing circuit configured to perform a process, on the basis of the information stored in the first memory element.

The present application claims the benefit of Japanese Priority Patent Application JP2019-048576 filed with the Japan Patent Office on Mar. 15, 2019, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor circuit comprising:
a first memory element including a first terminal, a second terminal coupled to a first node, and a tunnel barrier film, and configured to store information by breaking the tunnel barrier film;
a first transistor including a drain coupled to the first node, a source, a gate, and a back gate coupled to a second node; and
a second transistor including a drain, a source coupled to the second node, and a gate coupled to the first node.

2. The semiconductor circuit according to claim 1, further comprising a driver configured to perform a first operation that causes the first memory element to store the information, by applying a reference voltage to the source of the first transistor, applying a first voltage that is different from the reference voltage to the gate of the first transistor, applying a second voltage that is different from the reference voltage to the first terminal of the first memory element, and applying a third voltage that is different from the reference voltage to the drain of the second transistor.

3. The semiconductor circuit according to claim 2, wherein the driver is further configured to perform a second operation that reads the information from the first memory element, by applying the reference voltage to the source of the first transistor, applying the first voltage to the gate of the first transistor, and applying a fourth voltage that is different from the reference voltage to the first terminal of the first memory element.

4. The semiconductor circuit according to claim 3, wherein a difference voltage between the fourth voltage and the reference voltage is lower than a difference voltage between the second voltage and the reference voltage.

5. The semiconductor circuit according to claim 3, wherein the driver is configured to apply the third voltage to the drain of the second transistor in the second operation.

6. The semiconductor circuit according to claim 3, wherein the driver is configured to apply the reference voltage to the drain of the second transistor in the second operation.

7. The semiconductor circuit according to claim 1, further comprising:
a second memory element including a first terminal, a second terminal coupled to the first node, and a tunnel barrier film, and configured to store information by breaking the tunnel barrier film;
a third transistor including a drain coupled to the first node, a source, a gate, and a back gate coupled to the second node;
a first control line coupled to the gate of the first transistor and the gate of the third transistor;
a second control line coupled to the first terminal of the first memory element;
a third control line coupled to the first terminal of the second memory element; and
a fourth control line coupled to the drain of the second transistor.

8. The semiconductor circuit according to claim 7, further comprising:
a fifth control line coupled to the source of the first transistor; and
a driver configured to perform a first operation that causes the first memory element to store the information, by applying a reference voltage to the fifth control line, applying a first voltage that is different from the reference voltage to the first control line, applying a second voltage that is different from the reference voltage to the second control line, placing the third control line into a floating state, and applying a third voltage that is different from the reference voltage to the fourth control line.

9. The semiconductor circuit according to claim 8, further comprising
a sixth control line coupled to the source of the third transistor, wherein
the driver is configured to apply the reference voltage to the sixth control line in the first operation.

10. The semiconductor circuit according to claim 8, further comprising
a sixth control line coupled to the source of the third transistor, wherein
the driver is configured to place the sixth control line into the floating state in the first operation.

11. The semiconductor circuit according to claim 8, wherein the fifth control line is further coupled to the source of the third transistor.

12. The semiconductor circuit according to claim 8, wherein the driver is further configured to perform a second operation that reads the information from the first memory element, by applying the reference voltage to the fifth control line, applying the first voltage to the first control line, applying a fourth voltage that is different from the reference voltage to the second control line, and placing the third control line into the floating state.

13. The semiconductor circuit according to claim 1, wherein the tunnel barrier film includes a material comprising MgO or alumina.

14. The semiconductor circuit according to claim 1, further comprising a memory circuit including a magnetic tunnel junction device having a tunnel barrier film.

15. An electronic apparatus comprising:
a first memory element including a first terminal, a second terminal coupled to a first node, and a tunnel barrier film, and configured to store information by breaking the tunnel barrier film;
a first transistor including a drain coupled to the first node, a source, a gate, and a back gate coupled to a second node;
a second transistor including a drain, a source coupled to the second node, and a gate coupled to the first node; and
a processing circuit configured to perform a process, on a basis of the information stored in the first memory element.

* * * * *